(12) United States Patent
Sumitani

(10) Patent No.: US 7,656,083 B2
(45) Date of Patent: Feb. 2, 2010

(54) LIGHT EMITTING DEVICE HAVING A BACKSIDE ELECTRODE PORTION AND SAME THICKNESS PROTRUSION AND METHOD OF MANUFACTURING THE SAME

(75) Inventor: Naofumi Sumitani, Itano-gun (JP)

(73) Assignee: Nichia Corporation, Tokushima (JP)

( * ) Notice: Subject to any disclaimer, the term of this patent is extended or adjusted under 35 U.S.C. 154(b) by 428 days.

(21) Appl. No.: 11/012,666

(22) Filed: Dec. 16, 2004

(65) Prior Publication Data
US 2005/0127816 A1    Jun. 16, 2005

(30) Foreign Application Priority Data

Dec. 16, 2003  (JP) ............................. 2003-418002
Nov. 29, 2004  (JP) ............................. 2004-343742

(51) Int. Cl.
H01L 33/00    (2006.01)
H01L 27/15    (2006.01)

(52) U.S. Cl. .................. 313/498; 313/512; 257/98; 257/99

(58) Field of Classification Search ......... 313/498–500, 313/512; 362/800, 237; 257/98–100
See application file for complete search history.

(56) References Cited

U.S. PATENT DOCUMENTS 5,998,925 A * 12/1999 Shimizu et al. ............. 313/503
6,331,063 B1 * 12/2001 Kamada et al. ............. 362/237
6,812,503 B2 * 11/2004 Lin et al. ...................... 257/99
7,569,987 B2 *  8/2009 Naitou ......................... 313/503
2003/0090877 A1 *  5/2003 Ochiai et al. ................ 361/723
2004/0217692 A1 * 11/2004 Cho et al. .................... 313/503

FOREIGN PATENT DOCUMENTS

JP    2000-012894 A    1/2000
JP    2000-294833 A   10/2000

OTHER PUBLICATIONS

SUNLED Corporation, "Products—LED Displays- Light Bar and Bar Graph", www.sun-led.com, printout dated Oct. 9, 2003.

* cited by examiner

*Primary Examiner*—Karabi Guharay
(74) *Attorney, Agent, or Firm*—Smith Patent Office

(57) ABSTRACT

A light emitting device capable of emitting an excellent mixed color light, and a light emitting device capable of enhancing the concentration of mixed light or the directivity of emission is provided. The light emitting device comprises a light emitting element and a package. The package includes at least two recesses each having a bottom surface for mounting a light emitting element thereon and a side surface extending from the bottom surface, wherein each recess has, in a vertical cross section of the recess, a vertical line passing through the center of the bottom surface of the recess which is different than a vertical line passing through the intersection of a first straight line extending along an inclined edge of the recess and a second straight line extending along an inclined edge on another side of the recess.

11 Claims, 22 Drawing Sheets

LIGHT EMITTING DEVICE HAVING A BACKSIDE ELECTRODE PORTION AND SAME THICKNESS PROTRUSION AND METHOD OF MANUFACTURING THE SAME

BACKGROUND OF THE INVENTION

1. Field of the Invention

The present invention relates to a light emitting device and a package for a light emitting device, which is used for a lighting apparatus, a display, a backlight of a portable telephone, a flash for cameras, an auxiliary light for time-varying image illumination and the like, and to a manufacturing method thereof.

2. Discussion of the Related Art

A light emitting device using a light emitting element is compact and emits light of a clear color with good power efficiency. It is also free from trouble such as a burn-out, because the light emitting element is a semiconductor element. Moreover, a light emitting element has an excellent initial drive characteristic, high vibration resistance and durability to endure repetitive ON/OFF operations. Due to such excellent properties, a light emitting device using a light emitting element such as a light emitting diode (LED) or a laser diode (LD) has been used as various light sources.

One example of a conventional semiconductor light emitting device is described below with reference to, for example, Japanese Patent KOKAI Publication No. 2000-294833. FIG. 22 is a schematic cross-sectional view showing a conventional semiconductor light emitting device. Hereinafter, the conventional semiconductor light emitting device will be described below with reference to FIG. 22.

In a semiconductor light emitting device 100, an electrode 102 for mounting a light emitting element and an electrode 103 for bonding are disposed on the opposite ends of the insulating substrate 101, and a light emitting element 104 is conductively mounted on the electrode 102 side. The light emitting element 104 and the electrode 103 are bonded with a wire 105, and the light emitting element 104 and the wire 105 are encapsulated by a resin forming a lens 106 covering the portion between the electrodes 102 and 103. Only one recess 101a is formed in the semiconductor light emitting device 100.

The electrodes 102 and 103 are disposed from the bottom surface to the side and top surfaces of the substrate 101, and form lands 102a and 103a respectively on the surface of the substrate 101 with a portion protruding toward the center thereof. A recess 101a having a side wall tapering towards the bottom surface is formed in the substrate 101 corresponding to the tip portion of the land 102a of the electrode 102, and the mounting portion 102b which is continuous with the tip of the land 102a is disposed in the recess 101a. The mounting portion 102b is formed with a side wall tapering towards the bottom surface as the recess 101a, so as to conform to the inner and bottom surfaces of the recess 101a.

Along a vertical cross section of the recess 101a, a vertical line 112 can be defined as a vertical line passing through the intersection of a first straight line 110 extending along an inclined edge 101b of the recess 101a and a second straight line 111 extending along an inclined edge 101c on the other side of the recess 101a. Also, in the cross section perpendicular to a top edge of the recess 101a, a vertical line 113 can be defined as a vertical line passing through the center of the bottom surface (mounting portion 102b) of the recess 101a.

The vertical line 112 passing through the intersection and the vertical line 113 passing through the center are identical. The light condensing section of the lens 106 is located on this identical line (optical axis). In this semiconductor light emitting device 100, light is condensed by the lens 106, so that light reflected from the side surfaces 101b and 101c of the recess 101a, which function as the reflecting surfaces, is condensed on the vertical line 113 (optical axis) passing through the center of the bottom surface (mounting portion 102b) of the recess 101a.

However, in the conventional light emitting device 100, only one recess 101a for mounting a light emitting element 104 is formed. Therefore, it is impossible to obtain a mixed color light by using at least two light emitting elements 104. Even in the case where a plurality of the semiconductor light emitting devices 100 are aligned in parallel, one semiconductor light emitting device enhances the light concentration. Therefore, the light emitted from adjacent semiconductor light emitting devices 100 do not produce a mixed color light.

It is, therefore, an object of the present invention is to provide a light emitting device capable of producing excellent mixed light. Another object of the present invention is to provide a light emitting device capable of enhancing the concentration of mixed light and controlling the directivity. Still another object of the present invention is to provide a package for such a light emitting device and a manufacturing method thereof.

SUMMARY OF THE INVENTION

The inventor of the present application conducted various experiments and research to solve the problems described above as described in the present invention.

The present invention relates to a light emitting device comprising a light emitting element and a package including a plurality of recesses, each recess having a bottom surface for mounting the light emitting element and a side surface extending from the bottom surface, wherein at least one of the plurality of recesses has, in a vertical cross section of the recess, a first angle between the top surface and an inclined side edge of the recess which is different than a second angle between the top surface and an inclined side edge on the other side of the recess. With this, a light emitting device which is capable of mixing light emitted from a light emitting element mounted in a recess and light emitted from an adjacent light emitting element, and which is capable of emitting an uniform mixed light, can be obtained. Moreover, by forming the recesses as described above, directional characteristics can be controlled.

A vertical cross section is a view taken through the surface on which the recesses are located.

It is preferable that the first angle is greater than 90° and smaller than 180°, the second angle is equal to or greater than 90° and smaller than 180°, and the first angle is greater than the second angle. In principle, an angle closer to the center of the light emitting device is assumed to be the first angle, when comparing the first angle and the second angle. With this, a light emitting device capable of emitting more uniform mixed light can be obtained.

The present invention also relates to a light emitting device comprising a light emitting element and a package including a plurality of recesses, each recess having a bottom surface for mounting the light emitting element and a side surface extending from the bottom surface; wherein at least one of the recesses has a configuration, in a vertical cross section of the recess, such that a vertical line passing through the center of the bottom surface of the recess has a different position than a vertical line passing through the intersection of a first straight line extending along an inclined side edge of the recess and a second straight line extending along an inclined edge on the other side of the recess.

With this construction, the light emitted from the light emitting element mounted in the recess can be mixed with the light emitted from the adjacent light emitting element, so that a light emitting device capable of emitting a uniform mixed light can be provided. Also, the directivity can be controlled by constructing the bottom surface and the side surface of the recess as described above. Moreover, the light emitting device according to the present invention can provide a higher emission output than a light emitting device whose vertical line passing through the center point described above is the same line as the vertical line passing through the intersection described above.

The light emitting device may comprise a package having two adjacent recesses, and in a vertical cross section of the two adjacent recesses, the two adjacent recesses are symmetrical about a vertical line passing through the midpoint relative to the adjacent edges of the two adjacent recesses. A light emitting device capable of emitting white light with an excellent color mixture property can be provided by mounting the light emitting elements whose emissions are complimentary colors in the respective recesses. Also, the concentration of light can be enhanced along the above-described line between the two recesses.

The light emitting device may comprise a package including a plurality of adjacent recesses, and in a vertical cross section of the plurality of adjacent recesses, the plurality of adjacent recesses are symmetrical about a vertical line passing through the center point of the plurality of adjacent recesses. A light emitting device having the highest emission output along the center point of the plurality of recesses can be provided. Moreover, a light emitting device capable of emitting various hues of lights uniformly can be provided by forming a recess having a red light emitting element, a recess having a green light emitting element, and a recess having a blue light emitting element, each mounted therein.

The light emitting element may be encapsulated by a transparent resin in the recess. With this construction, light can be emitted from a light emitting element having a high refractive index through a resin having a low refractive index to the air having a lower refractive index. Therefore, the light extraction from the light emitting element can be enhanced and the emission output can be improved.

The present invention also relates to a package including a plurality of recesses, each having a bottom surface for mounting a light emitting element thereon and a side surface extending from the bottom surface, wherein at least one of the plurality of recesses has, in a vertical cross section of the recess, a first angle between the top surface and an inclined side edge which is different than a second angle between the top surface and an inclined side edge on the other side of the recess. With this, a light emitting device, capable of mixing light emitted from a light emitting element mounted in a recess and light emitted from an adjacent light emitting element, and emitting uniform mixed light, can be obtained. Moreover, by forming the recesses as described above, the directional characteristic of the light can be controlled.

It is preferable that the first angle is greater than 90° and smaller than 180°, the second angle is equal to or greater than 90° and smaller than 180°, and the first angle is greater than the second angle. With this configuration, the light emitting device capable of emitting more uniform mixed light can be obtained.

The present invention also relates to a package including a plurality of recesses, each recess having a bottom surface for mounting a light emitting element and a side surface extending from the bottom surface, wherein at least one of the plurality of recesses has, in a vertical cross section of the recess, a vertical line passing through the center of the bottom surface of the recess which has a different position than a vertical line passing through the intersection of a first straight line extending along an inclined side edge of the recess and a second straight line extending along an inclined side edge on the other side of the recess. With this construction, a package for the light emitting device capable of emitting uniform mixed light can be provided.

In this device, light emitted from the light emitting element mounted in the recess is mixed with the light from the light emitting element mounted in the adjacent recess. Also, the directivity can be controlled by constructing the bottom surface and the side surface of the recess as described above. Moreover, the package for the light emitting device can be provided having a higher emission output than that of a light emitting device whose vertical line passes through the center point described above and which is the same line as the vertical line passing through the intersection described above.

It is preferable to dispose positive and negative electrodes on at least part of the bottom surface of the recess in the package. With this construction, the light emitting element and the positive and negative electrodes can be electrically connected with wires at a lower portion than the opening edge of the recess. Therefore, detachment of the wire at the interface between the encapsulant resin and air can be prevented. Also, there is no need for elevating the resin higher than the opening of the recess as is required in the conventional cases. Therefore, a resin having a lower viscosity can be used.

It is preferable to dispose the positive and negative electrodes so they extend from the bottom surface of the recess to the backside of the package, and to form a protrusion having the same thickness as the electrodes formed on the backside of the package. With this construction, bending of the package can be prevented when mounting the light emitting element by ultrasonic molding.

The package may have a plurality of resin injection ports on the rear or backside thereof. By providing a plurality of resin injection inlets on the mold in the resin injection step, a thinner package can be fabricated.

The package may include two adjacent recesses, and in a vertical cross section of the two adjacent recesses, the two adjacent recesses are symmetrical about a vertical line passing through the midpoint relative to the adjacent edges of the two adjacent recesses. A package for the light emitting device capable of emitting white light with an excellent color mixing characteristic can be provided, by mounting each light emitting element whose emissions are complementary colors in each recess respectively.

The package may include a plurality of adjacent recesses, and in a vertical cross section of the plurality of adjacent recesses, the plurality of adjacent recesses are symmetrical about a vertical line passing through the center point of the plurality of adjacent recesses. The package for the light emitting device whose highest emission output is on the line along the center point of the plurality of recesses can be provided. Moreover, a package for the light emitting device capable of emitting uniform light in various color hues can be provided by forming the recesses respectively mounting a red light emitting element, a green light emitting element, and a blue light emitting element.

The present invention also relates to a method for manufacturing a package having a plurality of recesses each having a bottom surface for mounting a light emitting element and a side surface extending on the bottom surface of the recess, and positive and negative electrodes disposed on at least a part of the bottom surface with a portion thereof exposed on the bottom surface of the recess comprising a step of injecting a resin into a mold which is formed to make a configuration wherein at least one of a plurality of recesses has, in a vertical cross section of the recess, a vertical line passing through the center of the bottom surface of the recess which is different than a vertical line passing through the intersection of a first straight line extending along an inclined side edge on the recess and a second straight line extending along an inclined side edge on the other side of the recess, a step for curing the resin, and a step for detaching the mold.

With this construction, the package used for the light emitting device capable of emitting uniform mixed light can be manufactured. In this device, light emitted from the light emitting element mounted in the recess is mixed with light from the adjacent light emitting element. Also, the directivity can be controlled by constructing the bottom surface and the side surface of the recess as described above. Moreover, the package can be provided for the light emitting device having a higher emission output than that of a light emitting device whose vertical line passes through the center point described above is the same line as the vertical line passing through the intersection described above.

In the step of injecting the resin, it is preferable to use a transfer-molding method. By this method, packages having substantially the same shape can be manufactured on a large-scale with ease.

In the step of injecting the resin, it is preferable to inject the resin from more than two inlets. The package can be fabricated thinner by providing a plurality of resin inlets on the mold in the step of injecting a resin.

The method for manufacturing a package may include a step following the step of detaching the mold, where the package has two adjacent recesses, and in a vertical cross section of the two adjacent recesses, the two adjacent recesses are symmetrical about a vertical line passing through the midpoint relative to the adjacent edges of the two adjacent recesses. A light emitting device capable of emitting white light with an excellent color mixing characteristic can be provided by mounting the light emitting devices so that they emit complimentary colors in their respective recesses. Also, the concentration of light can be enhanced in the portion between the two recesses.

The method for manufacturing a package may include a step following the step of detaching the mold, the package has a plurality of adjacent recesses, and in a vertical cross section of the plurality of adjacent recesses, the plurality of adjacent recesses are symmetrical about a vertical line passing through the center point of the plurality of adjacent recesses. A package for the light emitting device whose highest emission output is on the line along the center point of the plurality of recesses can be fabricated. Moreover, a package for the light emitting device capable of emitting uniform light in various color hues can be provided by forming the recesses and respectively mounting a red light emitting element, a green light emitting element, and a blue light emitting element. A light emitting device having highest emission output at the center point of the plurality of recesses can be fabricated.

The present invention also relates to a method for manufacturing a light emitting device having a light emitting element, a package having a plurality of recesses each having a bottom surface for mounting the light emitting element and a side surface extending from the bottom surface of the recess, and positive and negative electrodes disposed onto at least a part of the bottom surface with a portion thereof exposed from the bottom surface comprising the steps of:

injecting a resin into a mold which is formed to make a configuration wherein at least one of the recesses having, in a vertical cross section of the recess, a vertical line passing through a center of the bottom surface of the recess which has a different position than a vertical line passing through an intersection of a first straight line extending along an inclined side edge and a second straight line extending along an inclined side edge on the other side of the recess;

curing the resin;

detaching the mold; and mounting the light emitting element on the bottom surface of the recess of the cured package.

With this method, a light emitting device capable of emitting light of various color hues with an excellent color mixing property can be manufactured.

The method for manufacturing a light emitting device may comprise the steps of injecting a transparent resin into each recess of the package and curing the transparent resin. According to this construction, light can be emitted from a light emitting element having a high refractive index through a resin having a low refractive index to the air having a lower refractive index. Therefore, a light emitting device with enhanced light extraction and improved emission output can be manufactured.

DETAILED DESCRIPTION OF THE PREFERRED EMBODIMENTS

Preferred embodiments and examples of the light emitting device and the manufacturing method thereof and the package and the manufacturing method thereof according to the present invention will now be described in detail below with reference to the accompanying drawings. However, the scope of the present invention is not construed to be limited by the embodiments and examples.

Embodiment 1

Figure 1:
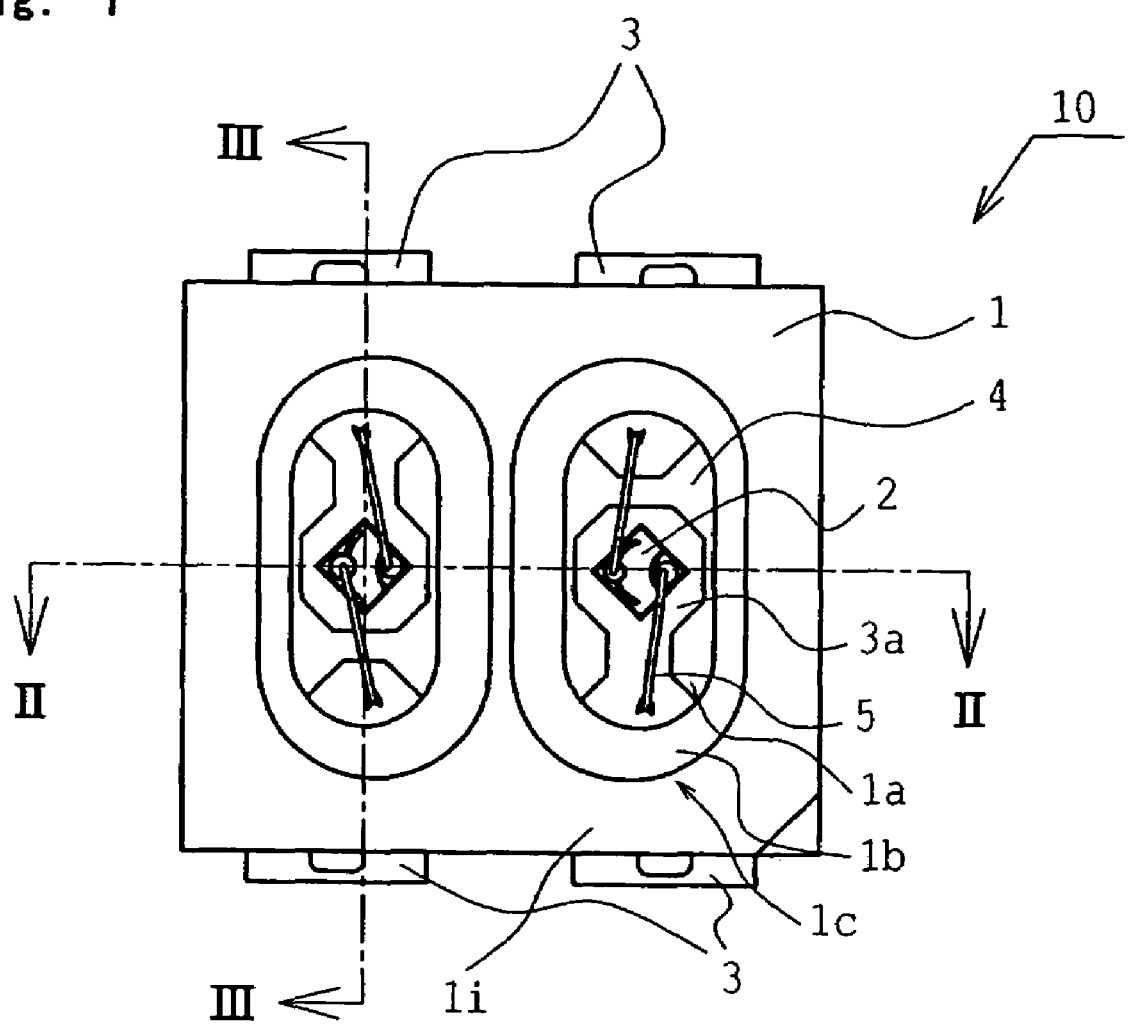
FIG. 1 shows a schematic plan view of a light emitting device according to the first embodiment of the present invention.
Figure 2:
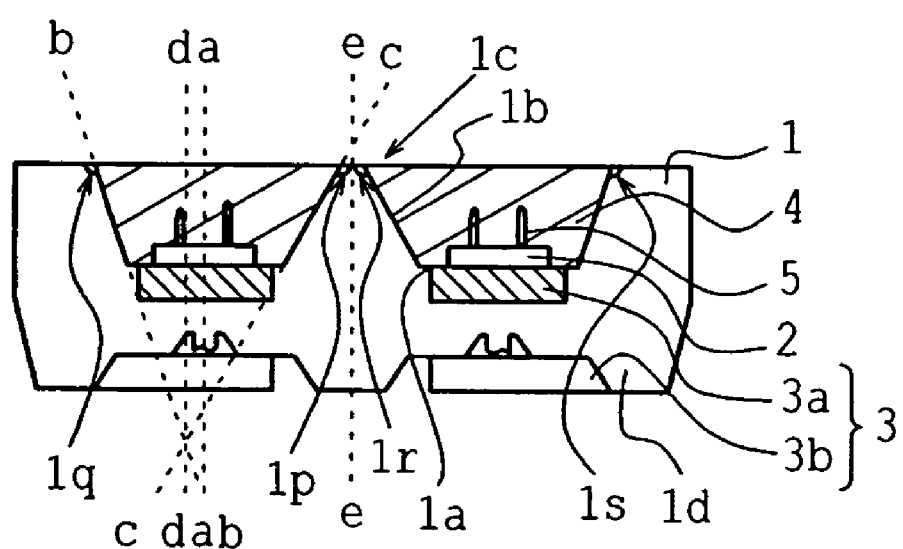
FIG. 2 shows a cross-sectional view taken along line II-II in FIG. 1 of a light emitting device according to the first embodiment of the present invention.
Figure 3:
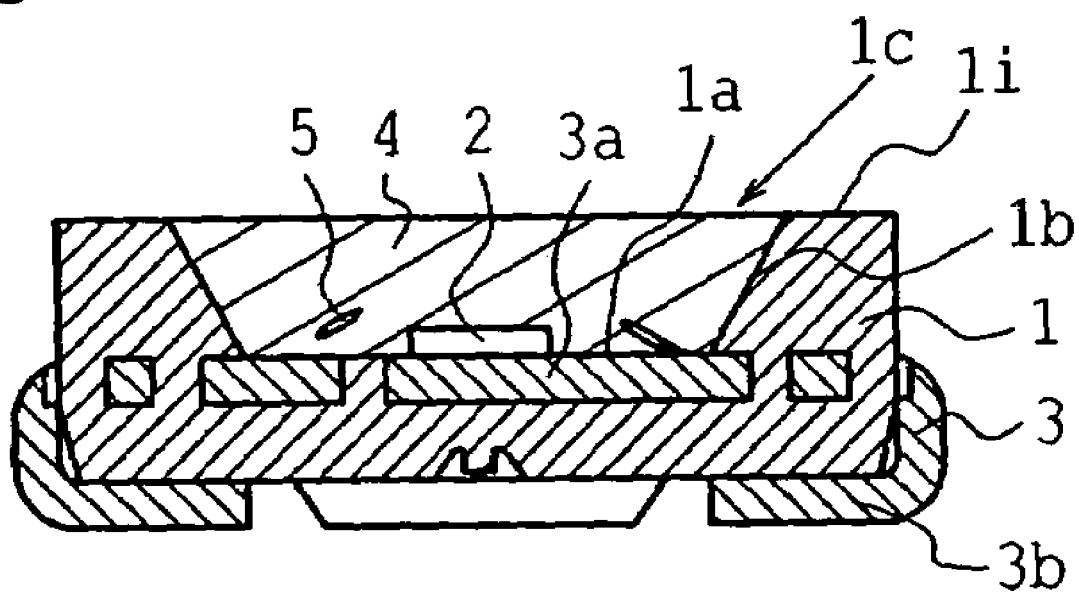
FIG. 3 shows a cross-sectional view taken along line III-III in FIG. 1 of a light emitting device according to the first embodiment of the present invention.
Figure 4:
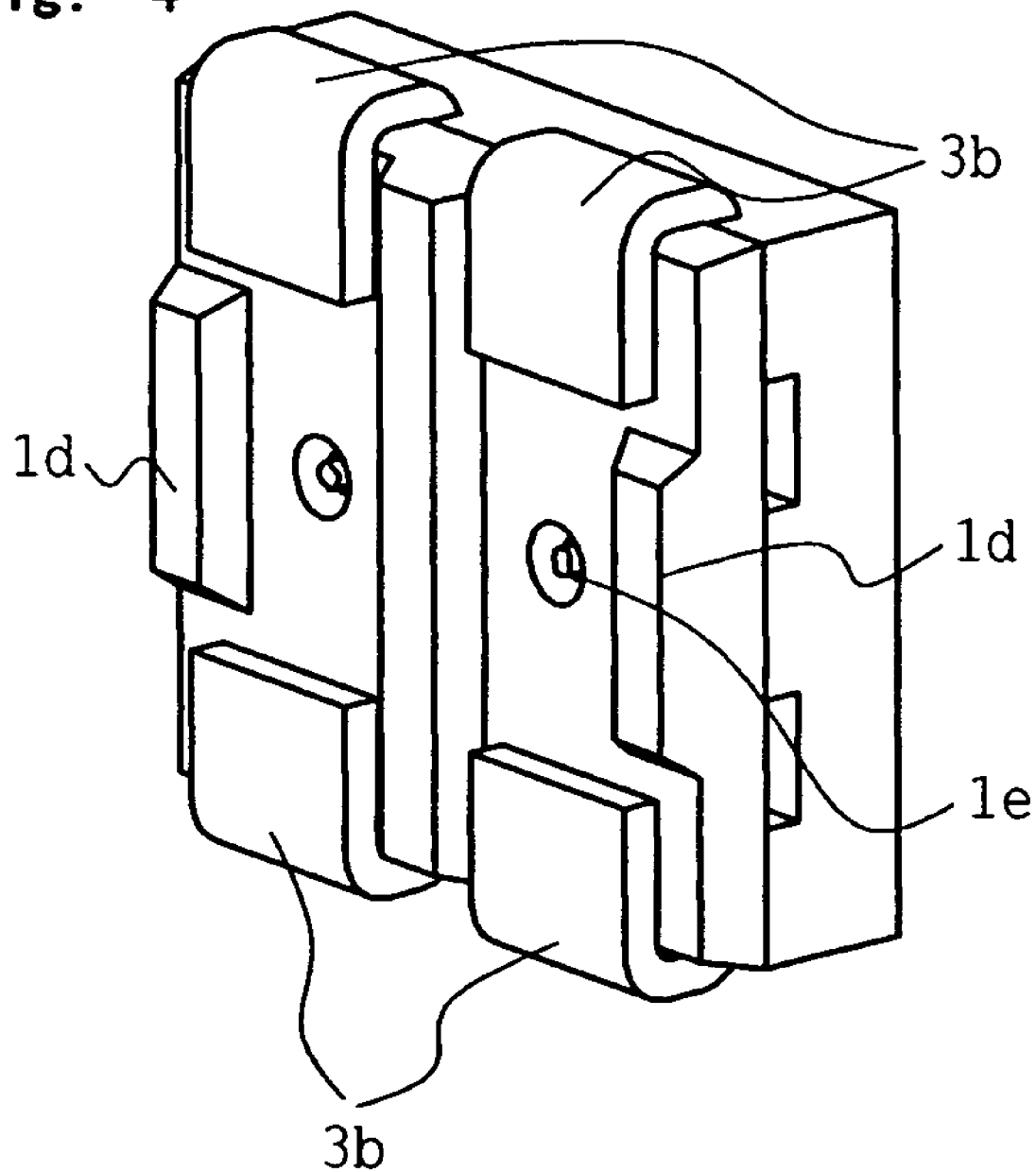
FIG. 4 is a schematic perspective view showing a rear side of a light emitting device according to the first embodiment of the present invention.

FIG. 1 is a schematic plan view showing a light emitting device according to the first embodiment. FIG. 2 shows a cross-sectional view taken along line II-II of a light emitting device according to the first embodiment of the present invention. FIG. 3 shows a cross-sectional view taken along line III-III of a light emitting device according to the first embodiment of the present invention. FIG. 4 is a schematic perspective view showing a rear side of a light emitting device according to the first embodiment of the present invention.

(Light Emitting Device)

The light emitting device 10 according to the first embodiment comprises a light emitting element 2 and a package 1 formed with two recesses each having a bottom surface 1a for mounting the light emitting element 2 and a side surface 1b extending from the bottom surface 1a. An electrode 3 is disposed on the bottom surface 1a of the recess 1c of the package 1, and the light emitting element 2 is mounted on the mounting portion 3a of the electrode 3.

The light emitting element 2 is, for example, made of a GaN-system. An n-type compound semiconductor is stacked on an insulative sapphire substrate and a p-type compound semiconductor is stacked thereon. In this light emitting element 2, the sapphire substrate is located on the upper surface of the electrode 3. An n-side electrode disposed on the upper surface of the n-type layer of the compound semiconductor is electrically connected to the electrode 3 with a wire 5. Also, a p-side electrode disposed on the upper surface of the p-type layer of the compound semiconductor is electrically connected to the electrode 3 with a wire 5. The electrode 3 consists of a pair of positive and negative electrodes. The InGaN, GaP, and GaAs systems can be used for the light emitting element 2, other than the GaN system. In addition to a light emitting element capable of emitting a visible light such as blue, green, yellow, and red, a light emitting element capable of emitting an ultraviolet light or an infrared light can also be used as the light emitting element 2.

Further, for example, a light emitting element of the GaP system can also be used as the light emitting element 2. In the light emitting element 2, a compound semiconductor whose p-n junction area is designed to be a light emitting layer is stacked on a conductive n-type substrate. In this light emitting element 2, the n-side electrode formed on the bottom surface of the substrate is fixed to the mounting portion of the electrode 3 with a conductive adhesive material, and the n-side electrode formed on the top surface of the n-type layer of the compound semiconductor is electrically connected to the electrode 3 with a wire 5. The p-side electrode formed on the top surface of the p-type layer of the compound semiconductor is electrically connected to the electrode 3 with a wire 5.

Two recesses 1c are formed on the package 1, where their openings are wider than their bottoms. Each recess 1c is defined by a bottom surface 1a and a side surface 1b. In the vertical cross section of the recess, a first angle 1p formed between the top surface 1i and an inclined side edge 1b of the recess 1c is different than a second angle 1q formed between the top surface 1i and an inclined side edge 1b on the other side of the recess 1c. The first angle 1p is larger than 90 degrees and smaller than 180 degrees. The second angle 1q is equal to or larger than 90 degrees and smaller than 180 degrees, and the first angle 1p is larger than the second angle 1q. In the same manner, in one of the two recesses, the first angle 1r and the second angle 1s are different. The first angle 1r is larger than 90 degrees and smaller than 180 degrees, the second angle 1s is equal to or larger than 90 degrees and smaller than 180 degrees, and the first angle 1r is larger then the second angle 1s. The first angle 1p of one of the two recesses 1c and the first angle 1r of the other recess 1c are the same angles, and the second angle 1q of one of the two recesses 1c and the second angle is of the other recess 1c are the same angles.

A recess 1c having a wider opening than the bottom is formed on the package 1. The recess 1c has a bottom surface 1a for mounting the light emitting element 2 and a side surface 1b extending from the bottom surface 1a. The package 1 has, in a vertical cross section of the recess 1c, a vertical line a-a passing through the center of the bottom surface 1a of the recess 1c which is different than a vertical line d-d passing through the intersection of a first straight line b-b extending along an inclined side edge 1b of the recess 1c and a second straight line c-c extending along an inclined side edge 1b on the other side of the recess 1c. In the case where the vertical line d-d passing through the intersection is located closer to the edge of the package than the vertical line a-a passing through the center, a light emitted from the light emitting element 2 is mixed with a light from adjacent light emitting element above approximately the center of the adjacent recess 1c, so that a desired uniform mixed light can be obtained.

On the other hand, in the case where the vertical line d-d passing through the intersection is located closer to the adjacent recess than the vertical line a-a, light emitted from the light emitting element 2 is mixed with light from the adjacent light emitting element above approximately the center of the adjacent recess 1c, and an emission with high luminance is obtained approximately above the center of the adjacent recess 1c. Therefore, a high luminance and uniform mixed light can be obtained. It is preferable that in a vertical cross section of the two recesses 1c, the two adjacent recesses 1c are symmetrical about the vertical line e-e passing through the midpoint of the adjacent edges of the two adjacent recesses. With this construction, light emitted from the light emitting elements 2 can be mixed uniformly.

The backside electrode portion 3b, which is extending from the mounting portion 3a formed on the bottom surface 1a of the recess 1c, is located on the rear surface of the package 1. The thickness of the backside electrode portion 3b and the protrusion 1d on the backside of the package 1 are preferably the same when the light emitting element 10 is mounted. With this construction, stability of mounting the light emitting element 10 can be improved.

The backside of the package 1 has two resin injection ports 1e. A thinner package can be fabricated by providing a plurality of resin injection inlets on the mold when forming the package 1. The shape of the package is not specifically limited and a various projection configurations such as of a circle, oval, rectangle, polygon, and similar shapes thereof can be used for the shape of the bottom of the package. The size of the package 1 is not specially limited, and for example, the package may be from 0.1 $mm^2$ to 100 $mm^2$ in size. The thickness of the package 1 may be about 100 μm to about 10 mm. The material for the package 1 is not specifically limited and any known material, normally one or more kinds of heat resistant resin such as a thermoplastic engineering polymer and a thermosetting resin are used. Specific examples of such resins include a liquid crystal polymer (LCP), a polyphenylene sulfide (PPS), an aromatic nylon (PPA), an epoxy resin, and a hard silicone resin. Especially, a thermoplastic engineering polymer is suitable in view of the cost. Moreover, one or more kinds of inorganic filler and the like can be added to the resin described above. Such fillers include titanium oxide, zinc oxide, alumina, silica, barium titanate, calcium phosphate, calcium carbonate, white carbon, talc, magnesium carbonate, boron nitride, and glass fiber. An appropriate amount of additive such as an antioxidant, a thermal stabilizer, and a photostabilizer may also be added. For example, it is suitable to add an inorganic filler from 10 to 80 weight parts, and preferably from 40 to 80 weight parts, in relation to 100 weight parts of a resin.

The shape of the opening of the recess 1c of the package 1 is substantially oval. It is preferable that in the substantially oval shape, one diameter is twice the length of the other diameter. Approximately circle or square shapes can be obtained by aligning two substantially oval shapes. With this configuration, a uniform mixed light can be obtained. Furthermore, by forming the top edge of the recess as an oval, the wire 5 can be prevented from being exposed at the top of the transparent resin 4, even when a volumetric shrinkage occurs due to curing of the transparent resin 4. This is because a dent formed in the center of an oval shape is smaller than that of a circular shape.

The electrode 3 includes a mounting portion 3a for mounting the light emitting element 2 and a backside electrode portion 3b extending from the mounting portion 3a. The backside electrode portion 3b is disposed so as to connect to an external electrode. The electrode 3 is formed by way of electroless plating on copper, or by way of electroplating of nickel and gold on a copper foil following the steps of, for example, exposure process, etching, and resist removal treatment. The electrode 3 can also be formed with a high thermal conductive material such as an alloy of copper and iron. The surfaces of these alloys may be silver-plated, aluminum-plated, or gold-plated.

The light emitting element 2 can be mounted on the mounting portion 3a in a face-up manner by die bonding. The light emitting element 2 can also be mounted in a face-down manner via a solder bump, a gold bump, and the like. In other cases, the light emitting element 2 is mounted on a protective component and then the protective component is mounted on the electrode 3. Examples of a protective component include a zener diode, a condenser, and a diac.

A zener diode includes a p-type semiconductor region having a positive electrode and an n-type semiconductor region having a negative electrode. The negative and positive electrodes of the protective component are connected to the p-side and n-side electrodes of the light emitting element respectively, with an inverse-parallel connection. Even when an excessive voltage is loaded between the positive and negative electrodes, the inter-electrode voltage between the positive and negative electrodes of the light emitting element will be kept at the zener voltage. Therefore, by using a zener diode as the protective component, the light emitting element can be protected from an excessive voltage, and destruction or performance deterioration of the device can be prevented.

Chip components for surface mounting methods can be used as a condenser. Strip shaped electrodes are provided on both sides of the condenser having a structure described above, and these electrodes are connected to the positive and negative electrodes of the light emitting element respectively, with parallel connection. When an excess voltage is loaded between the positive and the negative electrodes, a charging current occurs due to the excess voltage and the terminal voltage of the condenser drops instantaneously. Thus, the applied voltage to the light emitting element can be prevented from surging and the light emitting element can be protected from excess voltage. Moreover, when a noise including high frequency content is applied, the condenser functions as a bypass condenser so that the external noise can be eliminated.

Epoxy resins, silicone resins, amorphous polyamides, and fluorocarbon resins and the like can be used as the transparent resin 4.

A fluorescent material may be mixed in the transparent resin 4. In the case where a fluorescent material is used, the light emitting element 2 functions as the excitation light source so that the fluorescent material is excited by the light emitted from the light emitting element and emits light having a different wavelength than the light emitted from the light emitting element 2. With this construction, the light emitting device 10 capable of emitting light with a variety of chromaticity values can be provided.

The fluorescent material is not specifically limited and yttrium aluminum garnet-based fluorescent materials activated with cerium, nitride-based fluorescent materials activated with europium, oxynitride-based fluorescent materials activated with europium, perylene-based derivatives, zinc selenide-based fluorescent materials activated with cerium, and the like can be used. A yttrium aluminum garnet-based fluorescent material activated with cerium includes at least one element selected from the group consisting of Y, Lu, Sc, La, Tb, Gd and Sm, and at least one element selected from the group consisting of Al, Ga, and In. A nitride-based fluorescent material activated with europium includes at least one element selected from the alkaline earth metals such as Ba, Sr, Ca, and at least one element selected from Group IVb elements such as Si and Ge, Sr, Ca, and nitrogen. An oxynitride-based fluorescent material activated with europium includes at least one element selected from the alkaline earth metals such as Ba, Sr, Ca, and at least one element selected from Group IVb elements such as Si and Ge, nitrogen, and oxygen.

(Method of Manufacturing the Package and Light Emitting Device)

A method of manufacturing the package 1 will be described below. The package 1 has a configuration defining two recesses each comprising a bottom surface 1a where a light emitting element 2 is to be mounted thereon, a side surface extending from the bottom surface 1a, positive and negative electrodes disposed on at least part of the bottom surface 1a and at least a portion thereof is exposed from the bottom surface 1a. The number of recesses is not limited to two and a plurality of recesses can be formed according to a similar method.

First, resin is injected into a mold, which has been formed so that the package 1 has, in a vertical cross section of the recess 1c, a vertical line a-a passing through the center of the bottom surface 1a of the recess 1c which is different than a vertical line d-d passing through the intersection of a first straight line b-b extending along an inclined side edge 1b of the recess 1c and a second straight line c-c extending along an inclined side edge 1b on the other side of the recess 1c.

It is preferable to use a transfer-molding method in the resin injection step. The package 1 can be formed by selecting a injection method such as injection molding, extrusion molding, compression molding, cast molding, vacuum molding, and laminate molding, according to the material, etc. In this injection step, it is preferable to inject a resin from two or more inlets into the mold. Especially, it is preferable to inject the resin from the back surface side of the package 1, which is the opposite side to the bottom surface 1a of the recess 1c. The package 1 may be formed by using a mold which is formed to make a configuration wherein two adjacent recesses 1c having, in a vertical cross section of the two adjacent recesses, the two adjacent recesses 1c are symmetrical about the vertical line e-e passing through a mid point between the adjacent edges of the two adjacent recesses.

Next, the resin is cured. The curing of the resin can be carried out with one step, in which the resin is cured in the mold. The curing may also be carried out in two steps, in which the resin is cured preliminarily in the mold, then, the mold is removed and the curing is completed.

Next, the mold is detached. Thus, the package 1 is fabricated. It is preferable to apply a surface treatment onto the inner surface of the mold so as to ease the detachment of the package 1 from the mold.

Then, a light emitting element 2 is mounted on the inner surface 1a of the recess 1c of the package 1. The light emitting element 2 can also be mounted in a face-up manner, by using a die bonding resin such as an epoxy resin. After the light emitting element 2 is mounted in a face-up manner, the electrodes of the light emitting element 2 and the electrodes of the package 1 are electrically connected via wires 5 respectively. The light emitting element 2 can also be mounted in a face-down manner by way of an ultrasonic mounting method using a gold bump or a solder bump and the like.

Further, after injecting a light-transmissive resin 4 into the recess 1c of the package 1 of the light emitting device, the light-transmissive resin 4 is cured. Thus, the light emitting device 10 is fabricated. A fluorescent material may be mixed in the transparent resin 4 in advance.

Embodiment 2

Figure 5:
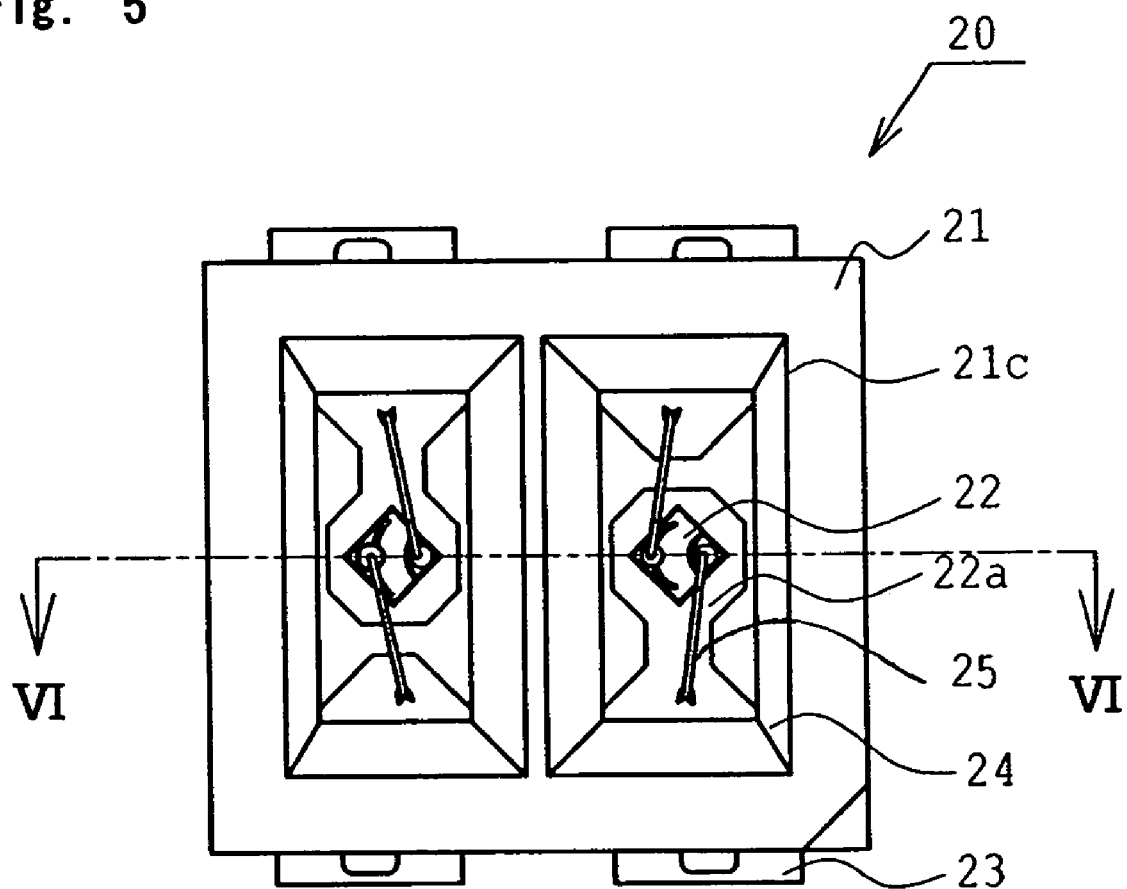
FIG. 5 shows a schematic plan view of a light emitting device according to the second embodiment of the present invention.
Figure 6:
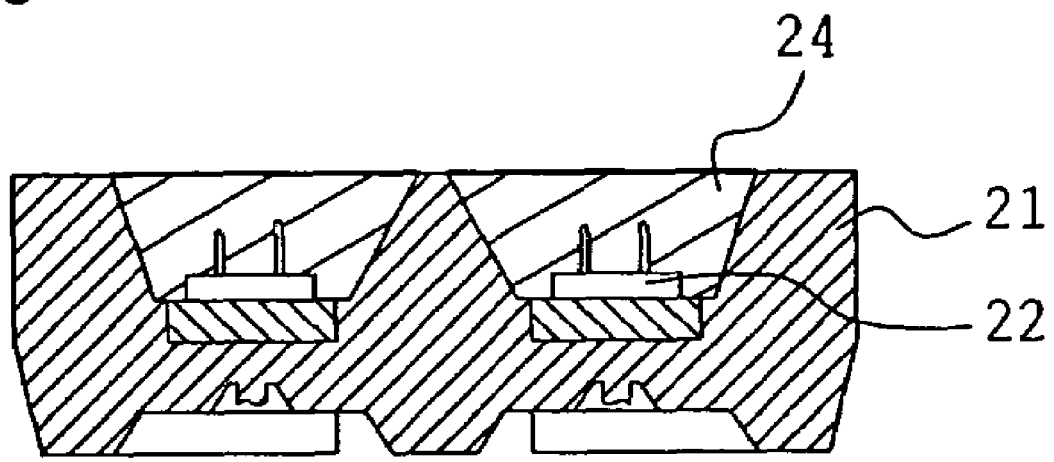
FIG. 6 shows a cross-sectional view taken along line VI-VI in FIG. 5 of a light emitting device according to the second embodiment of the present invention.

FIG. 5 is a schematic plan view showing a light emitting device according to Embodiment 2. FIG. 6 is a schematic cross-sectional view taken along line VI-VI in FIG. 5, showing the light emitting device according to Embodiment 2. A light emitting device according to Embodiment 2 will be described below, except for the construction and elements similar to Embodiment 1. As used herein, the various embodiments are described in the drawings according to the following explanation: the number used in the ten's (10) digit location is related to the number of the embodiment and the one's (1) digit location is used to indicate the same elements as described in connection with Embodiment 1.

The light emitting device 20 according to Embodiment 2 has a similar construction as the light emitting device 10 according to Embodiment 1, except for the configuration defining the recess 21c.

The top edge of the recess 21c of the package 21 is formed in the shape of a rectangle. It is preferable that one side of the rectangularly shaped opening is about twice the length of the other side. By placing two rectangular shapes adjacent to each other, an almost square shape can be formed. By arranging two light emitting devices in such a manner, uniform mixed light can be obtained. Moreover, by forming the opening with a rectangular shape, the wire 25 can be prevented from exposing from the light-transmissive resin 24 even when volumetric shrinkage occurs due to curing of the light-transmissive resin 24. One light emitting element 22 may be placed in a single recess; however, two or more light emitting elements may be placed in a single recess.

Embodiment 3

Figure 7:
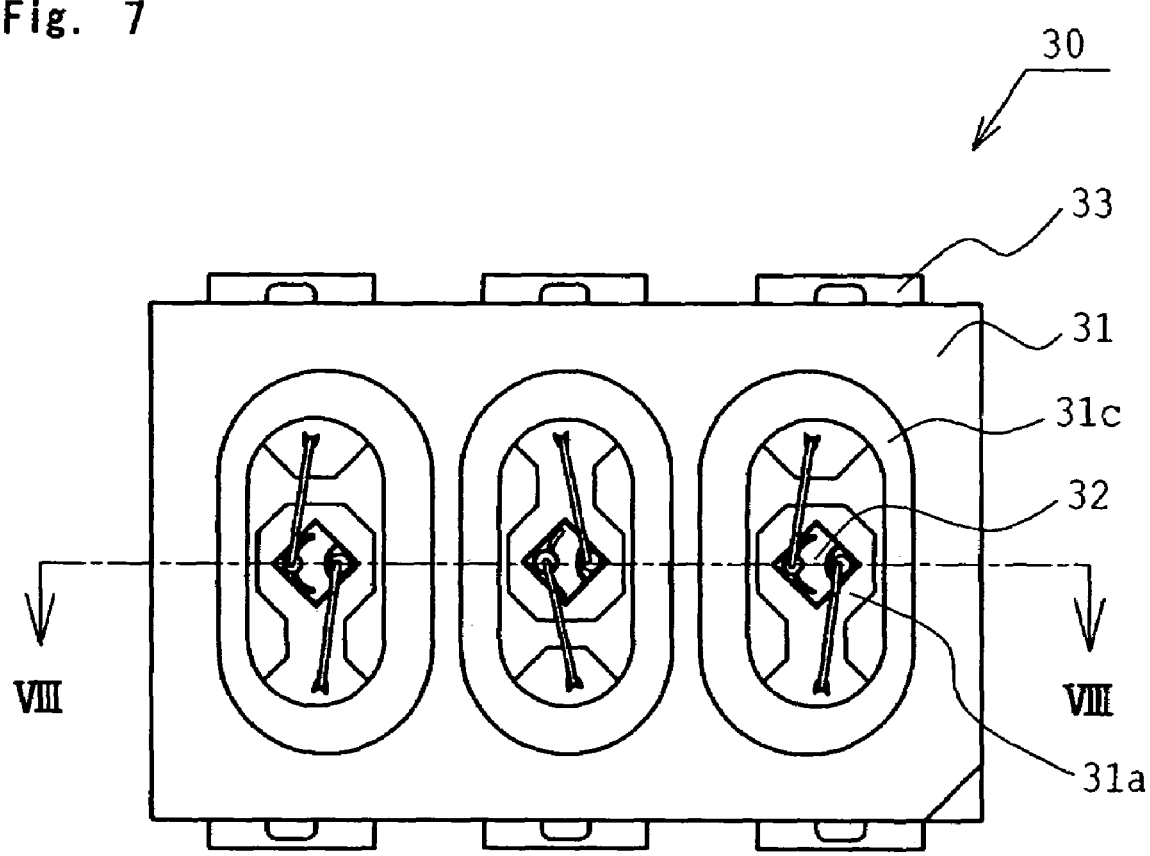
FIG. 7 shows a schematic plan view of a light emitting device according to the third embodiment of the present invention.
Figure 8:
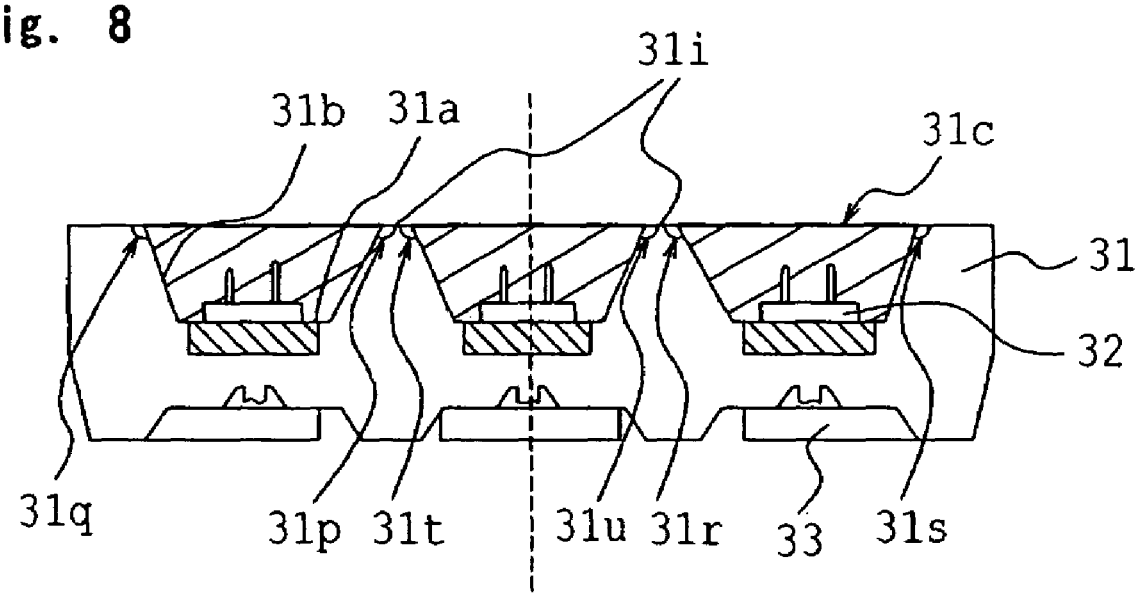
FIG. 8 shows a cross-sectional view taken along line VIII-VIII in FIG. 7 of a light emitting device according to the third embodiment of the present invention.

FIG. 7 is a schematic plan view showing a light emitting device according to Embodiment 3. FIG. 8 is a schematic cross-sectional view taken along line VIII-VIII of FIG. 7, showing the light emitting device according to Embodiment 3. A light emitting device according to Embodiment 3 will be described below, except for the construction similar to that in Embodiment 1. A light emitting device according to Embodiment 3 will be described below, except for the construction similar in Embodiment 1.

The light emitting device 30 according to Embodiment 3 has a similar construction as the light emitting device 10 according to Embodiment 1, except for the number and the size of the recesses 31c.

Three recesses 31c are formed in the package 31. Each recess is defined by a bottom surface 31a and a side surface 31b with the opening of the recess being wider than the bottom thereof. A recess 31c has, in a vertical cross section, a first angle 31p between the top surface 31i and an inclined side edge 31b of the recess 31c which is different than a second angle 31q between the top surface 31i and an inclined side edge 31b on the other side of the recess 31c. The first angle 31p is larger than 90 degrees and smaller than 180 degrees. The second angle 31q is equal to or larger than 90 degrees and smaller than 180 degrees, and the first angle 31p is larger than the second angle 31q. In the same manner, in another one of the three recesses 31c, the first angle 31r and the second angle 31s are different. The first angle 31r is larger than 90 degrees and smaller than 180 degrees, the second angle 31s is equal to or larger than 90 degrees and smaller than 180 degrees, and the first angle 31r is larger then the second angle 31s. The first angle 31p of one of the three recesses 31c and the first angle 31r of the another one of the three recesses 31c are the same angles, and the second angle 31q of one of the three recesses 31c and the second angle 31s of another one of three recess 31c are the same angles.

In the recess 31c which is in the middle of the three recesses, the two angles formed between the opposite inclined side edges 31b of the recess 31c and the respective top surfaces 31i are the same angles. The three recesses 31c are aligned side by side, and in the cross sectional configuration, the distal two recess are symmetrical about a vertical line passing through the center of the bottom surface of the recess 31c in the middle.

Three recesses 31c are formed on the package 31. The circumferential shape of each recess 31c is formed so as to be substantially oval. In the package 31, three recesses 31c are formed side by side. Here, in the distal two recesses, the center of the bottom surface is arranged closer to the distal side wall than to the center of the bottom surface of the recess in the middle. The center of the bottom surface 31a of the recess 31c in the middle is arranged almost the same distance from the opposite side walls of the recess 31c. With this configuration, an uniform mixed light can be obtained. Light emitting elements 32 each emit blue, green, and red light and are placed in each recess 31c, respectively. With this arrangement, a light emitting device 30 capable of emitting light with a variety of chromaticity values can be provided. On the other hand, two blue light emitting elements and two red light emitting elements 32 can be mounted respectively in the distal two recesses 31c, and one green light emitting element 32 can be mounted in the recess 31c in the middle. With this configuration, the light emitting device 30 capable of emitting light in a variety of chromaticity values with different brightnesses can be provided. In this device, the property of visibility is utilized.

Embodiment 4

Figure 9:
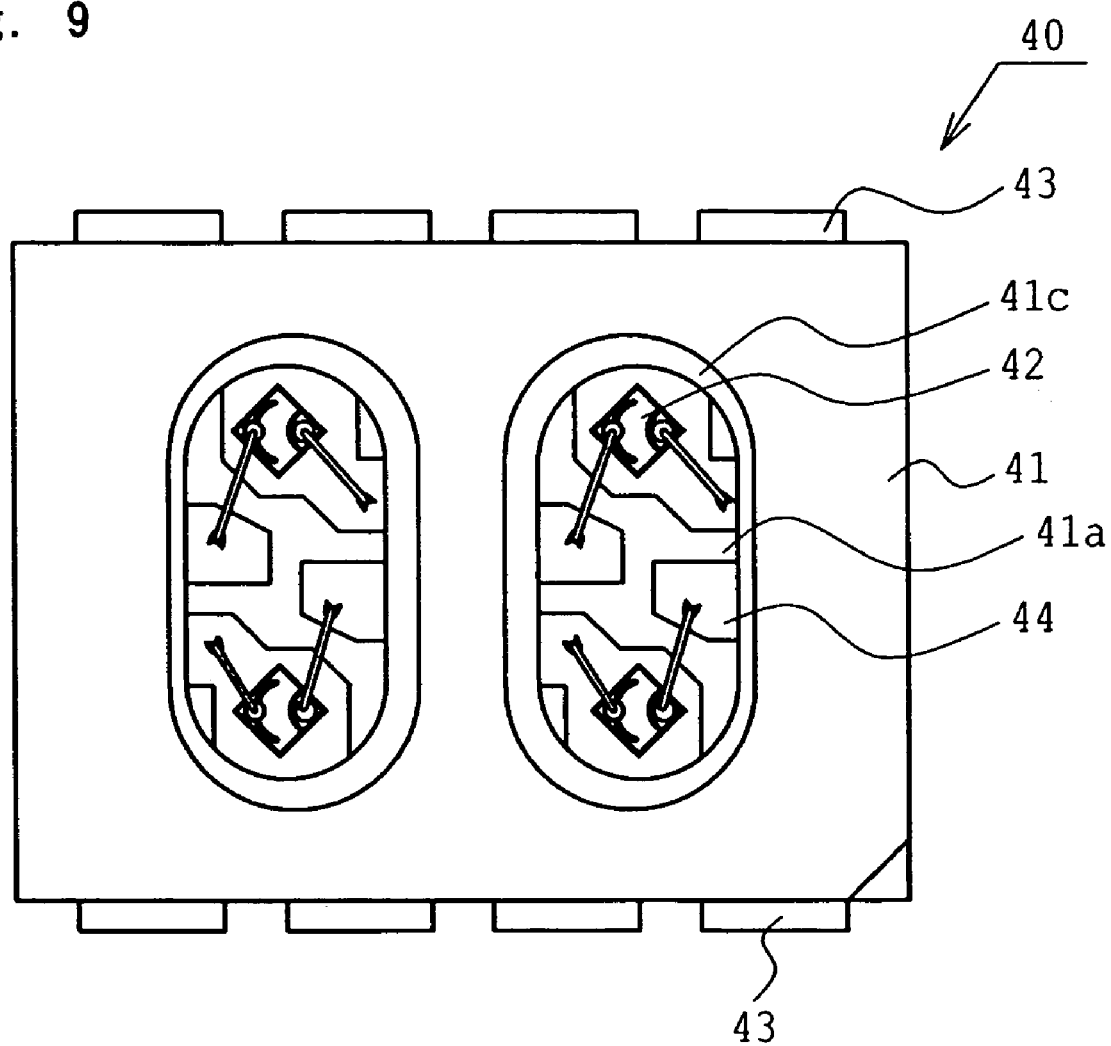
FIG. 9 shows a schematic plan view of a light emitting device according to the fourth embodiment of the present invention.

FIG. 9 is a schematic plan view showing a light emitting device according to Embodiment 4. A light emitting device according to Embodiment 4 will be described below, except for the construction similar to that in Embodiment 1.

The light emitting device 40 according to Embodiment 4 has a similar construction to the light emitting device 10 according to Embodiment 1, except for the number and locations of the light emitting elements mounted in the recesses 41c and the number and locations of the electrodes 43.

Two recesses 31c are formed in the package 41. Two light emitting elements 42 are mounted in each recess 31c; that is, the package includes 4 light emitting elements. With this construction, the distance between the adjacent light emitting elements can be shortened, so that the mixing property of lights from the light emitting elements can be improved. Therefore, the light emitting device 40 capable of emitting light in a wide chromaticity values range can be provided. Moreover, the wire 45 can be placed in a lower portion then the light-transmissive resin 44 filling the recess 41c, so that shearing of the wire 45 due to curing of the transparent resin 44 can be prevented. A pair of electrodes are provided to each of the light emitting elements 42 in the package 41, in order to improve the heat dissipation of the light emitting element 42.

Embodiment 5

Figure 10:
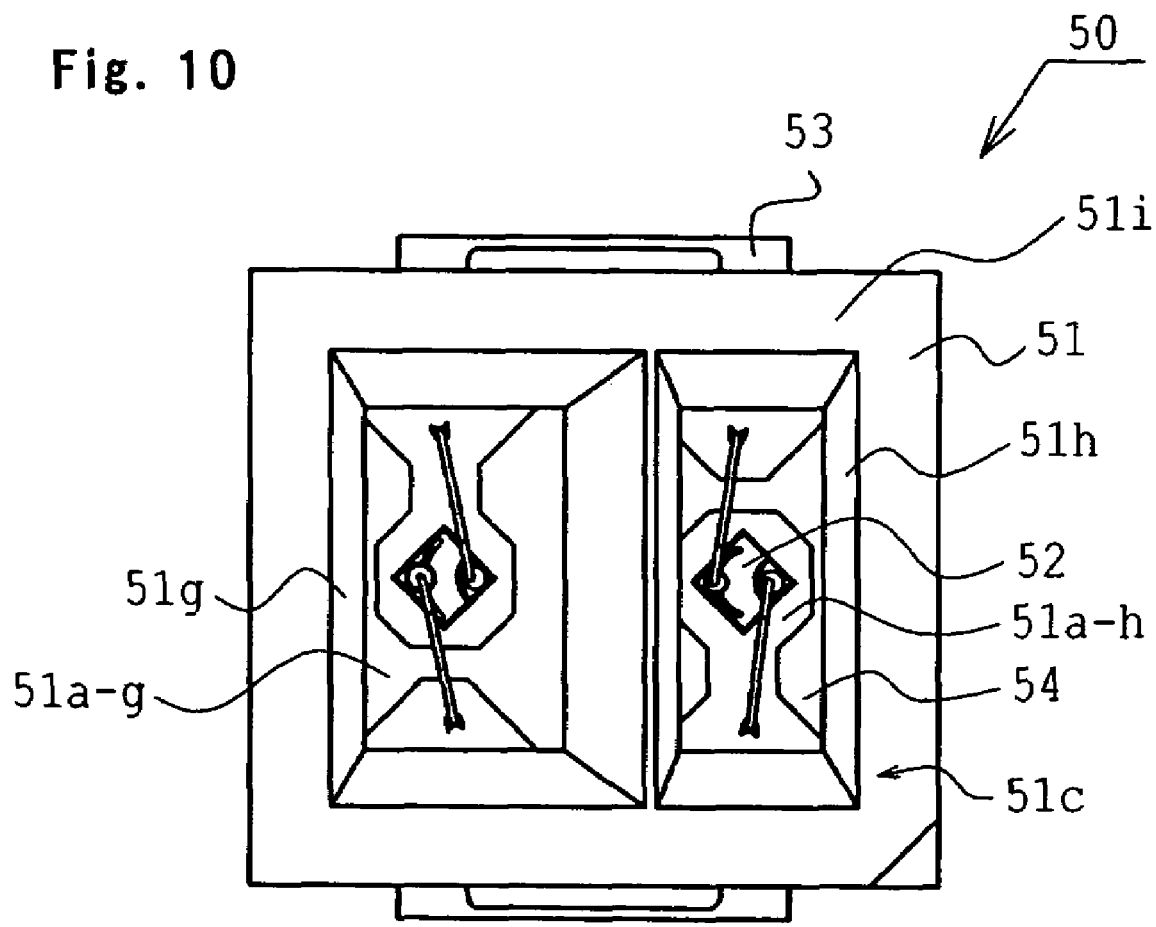
FIG. 10 shows a schematic plan view of a light emitting device according to the fifth embodiment of the present invention.
Figure 11:
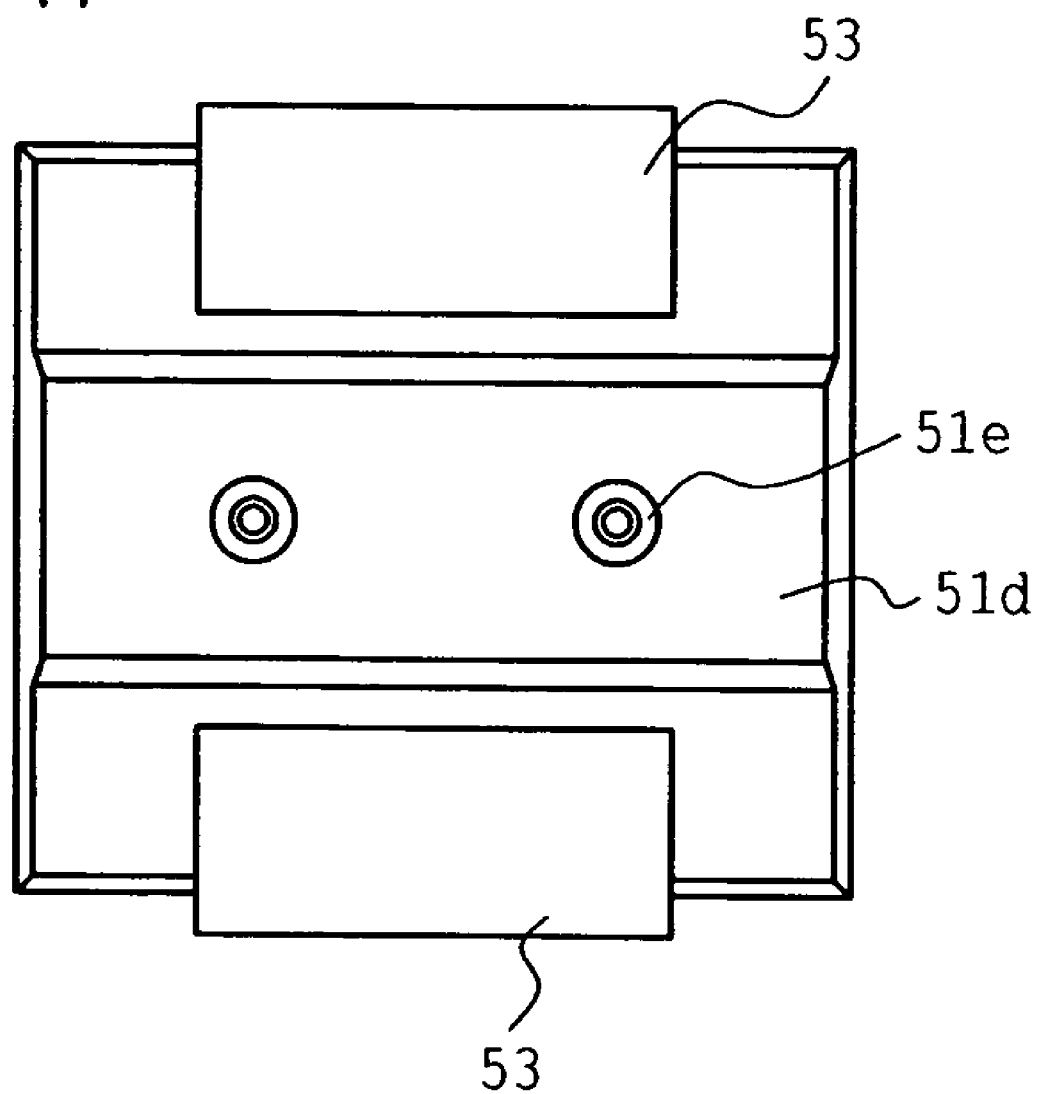
FIG. 11 is a schematic plan view showing a rear side of a light emitting device according to the fifth embodiment of the present invention.

FIG. 10 is a schematic plan view showing a light emitting device according to Embodiment 5. FIG. 11 is a schematic rear elevation showing a light emitting device according to Embodiment 5. A light emitting device according to Embodiment 5 will be described below, except for the construction similar to that in Embodiment 1.

The light emitting device 50 according to Embodiment 5 has a construction similar to the light emitting device 10 according to Embodiment 1, except for the shape, size, and location of the recesses 51c and the number and locations of the electrodes.

The openings of the recesses 51c of the package 51 are different sized rectangular openings. The recess 51g with wider opening is formed with the bottom surface 51a-g and the recess 51h with smaller opening is formed with the bottom surface 51a-h. The center of the bottom surface 51a-g of the recess 51g is located closer to the edge of the package than to adjacent recess 51h. The center of the bottom surface 51a of the other recess 51f is located in the center of the opening. With this construction, the light emitting device 50 capable of controlling directivity while maintaining its color mixing property can be provided.

In the recesses 51g and 51h in the package 51, a pair of electrodes 53 is electrically connected to the light emitting element 52 mounted in each recess.

Embodiment 6

Figure 12:
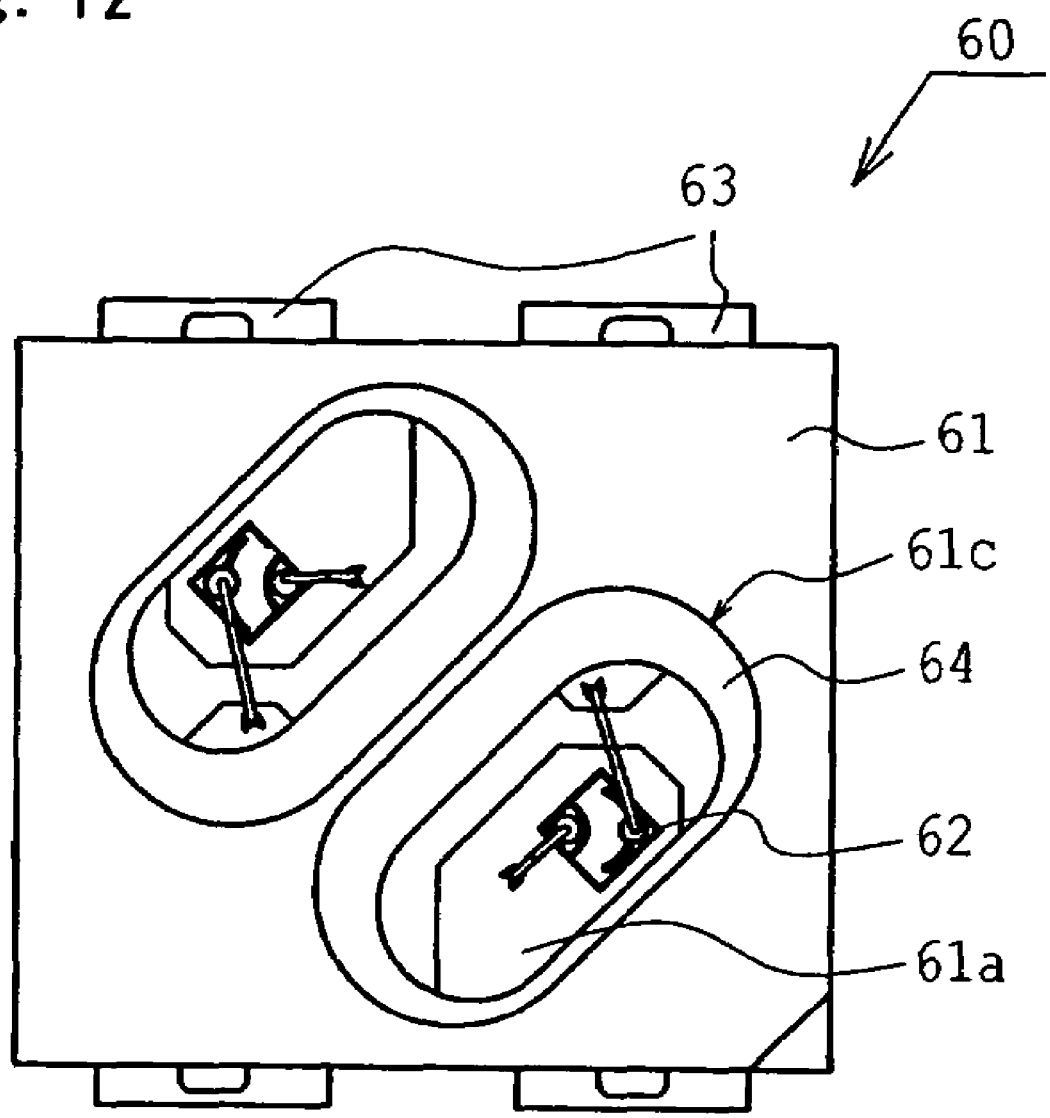
FIG. 12 shows a schematic plan view of a light emitting device according to the sixth embodiment of the present invention.
Figure 13:
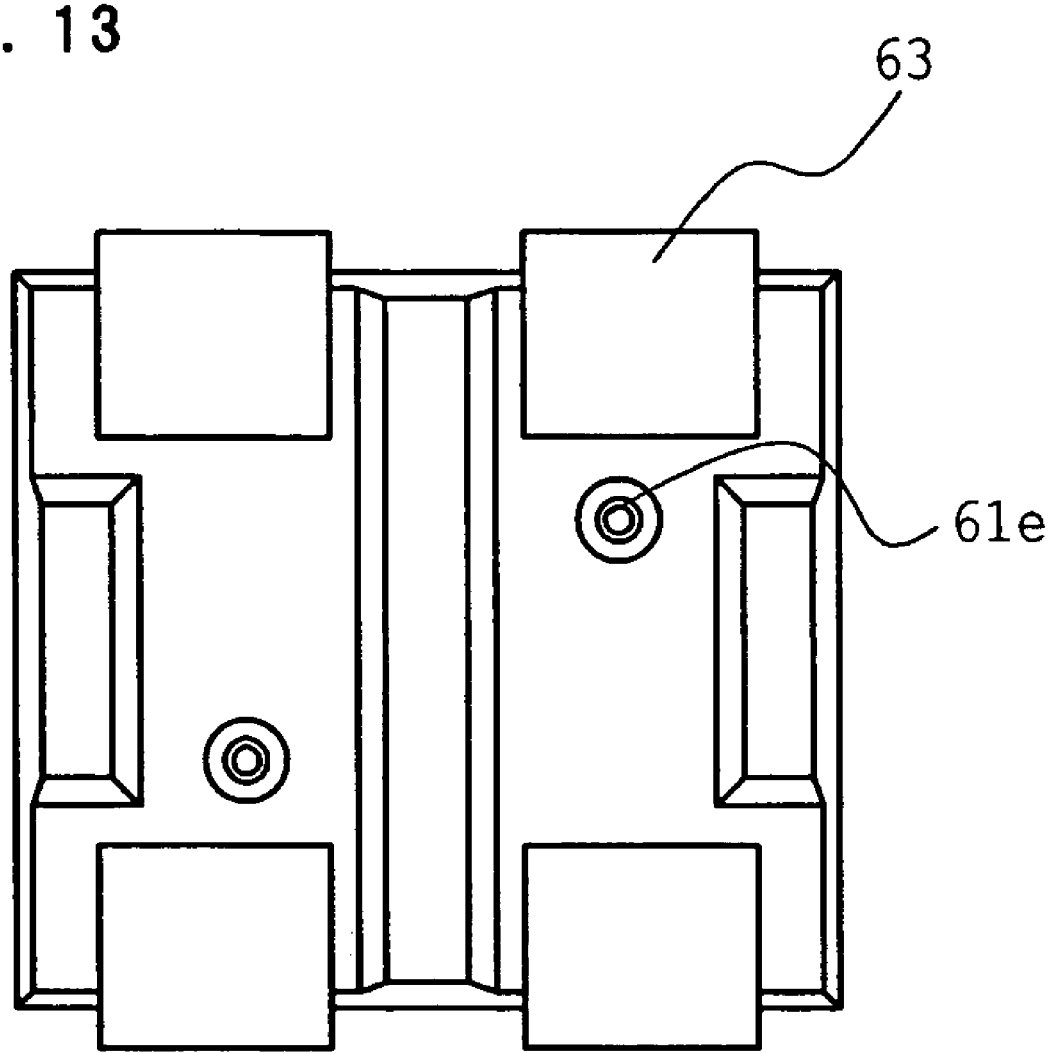
FIG. 13 is a schematic plan view showing a rear side of a light emitting device according to the sixth embodiment of the present invention.

FIG. 12 is a schematic plan view showing a light emitting device according to Embodiment 6. FIG. 13 is a schematic rear elevation showing a light emitting device according to Embodiment 6. A light emitting device according to Embodiment 6 will be described below, except for the construction similar to that in Embodiment 1.

The light emitting device 60 according to Embodiment 6 has a similar construction as the light emitting device 10 according to Embodiment 1, except for the location of the recesses 61c and the location of the resin injection ports 61e.

In the light emitting device 60 according to Embodiment 6, the circumferential shape of the recesses 61c are formed substantially elliptical, and the two recesses 61c are formed side by side and almost in parallel with the diagonal line of the package 61. The bottom surface 61a of each recess 61c is formed so as to be located closer to the edge than to the center of the recess 61c.

With this arrangement, the recess 61c in the light emitting device 60 can be formed larger in diameter than the recess 1c formed in the light emitting device 10. Thus, the light emitting device 60 with a wider orientation angle than a package of the same size can be provided. The package 61 can be molded by injecting a resin from the rear side of the recess 61c.

Embodiment 7

Figure 14:
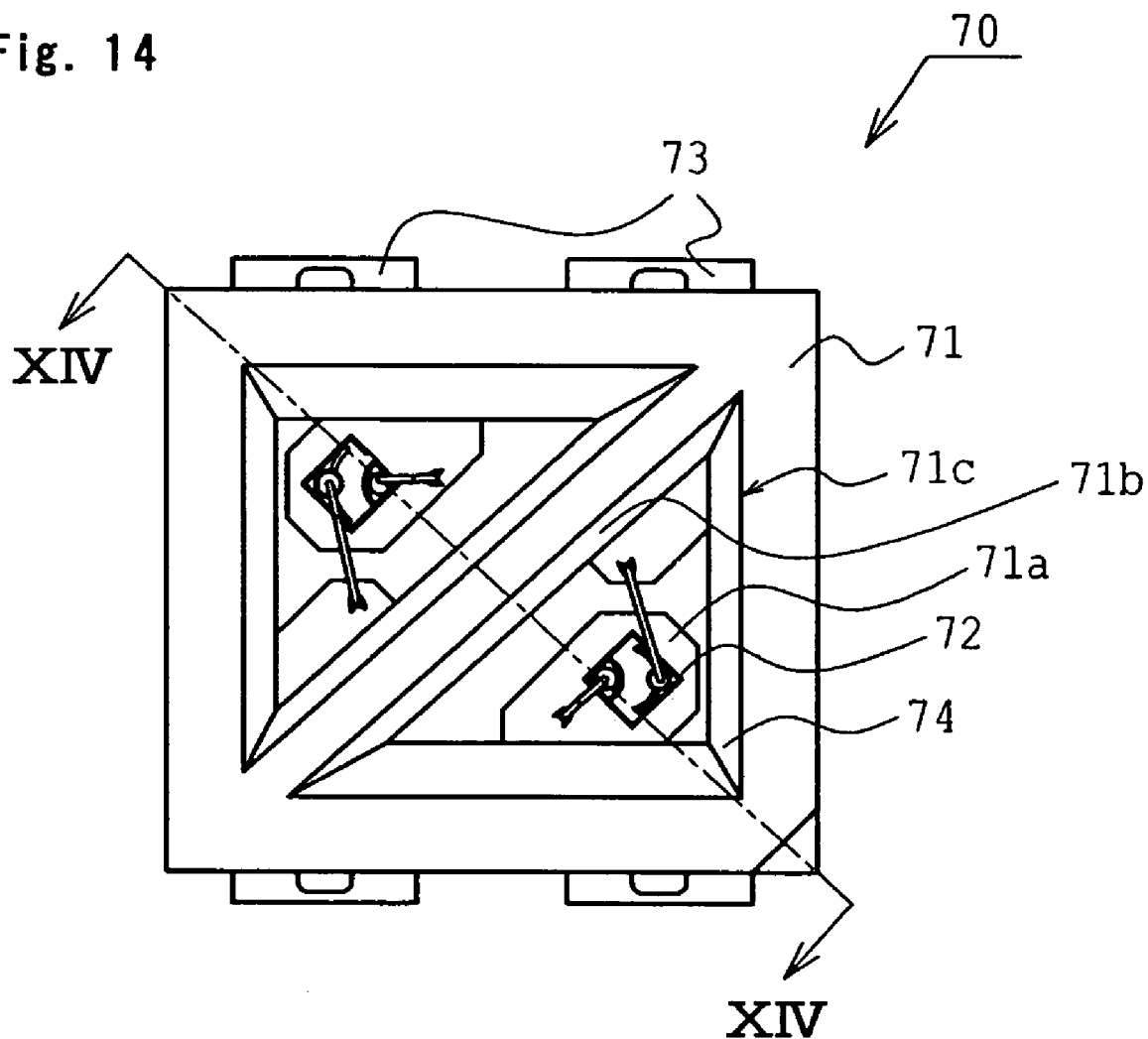
FIG. 14 shows a schematic plan view of a light emitting device according to the seventh embodiment of the present invention.
Figure 15:
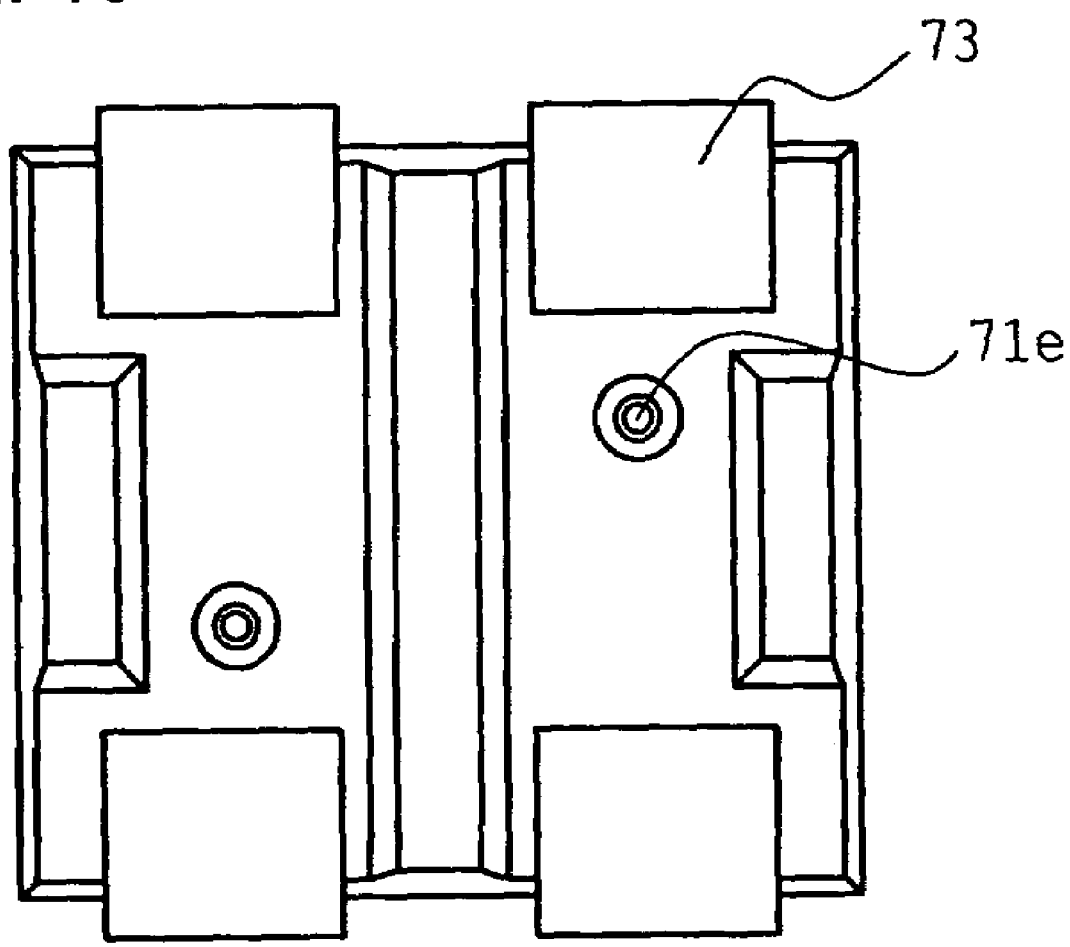
FIG. 15 is a schematic plan view showing a rear side of a light emitting device according to the seventh embodiment of the present invention.

FIG. 14 is a schematic plan view showing a light emitting device according to Embodiment 7. FIG. 15 is a schematic rear elevation showing a light emitting device according to Embodiment 7. A light emitting device according to Embodiment 7 will be described below, except for the construction similar to that in Embodiment 1.

The light emitting device 70 according to Embodiment 7 has a similar construction to the light emitting device 10 according to Embodiment 1, except for the shapes and locations of the recesses 71c and the locations of the resin injection ports 71e.

In the package 71, the circumferential shape of each recess 71c is formed as a substantially isosceles right triangle. Arranging two substantially isosceles right triangles to face each other along their respective hypotenuses can form a substantially square shape. The bottom surface 71a of the recess 71c has the same shape with a different size as the substantially isosceles right triangle shapes of the opening of the recess. Here, in the vertical cross section of the two distal recesses 71c taken along line XIV-XIV, a vertical line passing through the center of the bottom surface 71a of the recess 71c is different than a vertical line passing through the intersection of a first straight line extending along an inclined side wall 71b of the recess 71c and a second straight line extending along an inclined side wall 71b on the other side of the recess 71c. The vertical line passing through the intersection is located closer to the edge of the package than the vertical line passing through the center of the recess. With this arrangement, uniform mixed light can be obtained.

The package 71 can be molded by injecting a resin from the resin injecting inlets at the rear surface side of the bottom surface 71a of the recess 71c.

Embodiment 8

Figure 16:
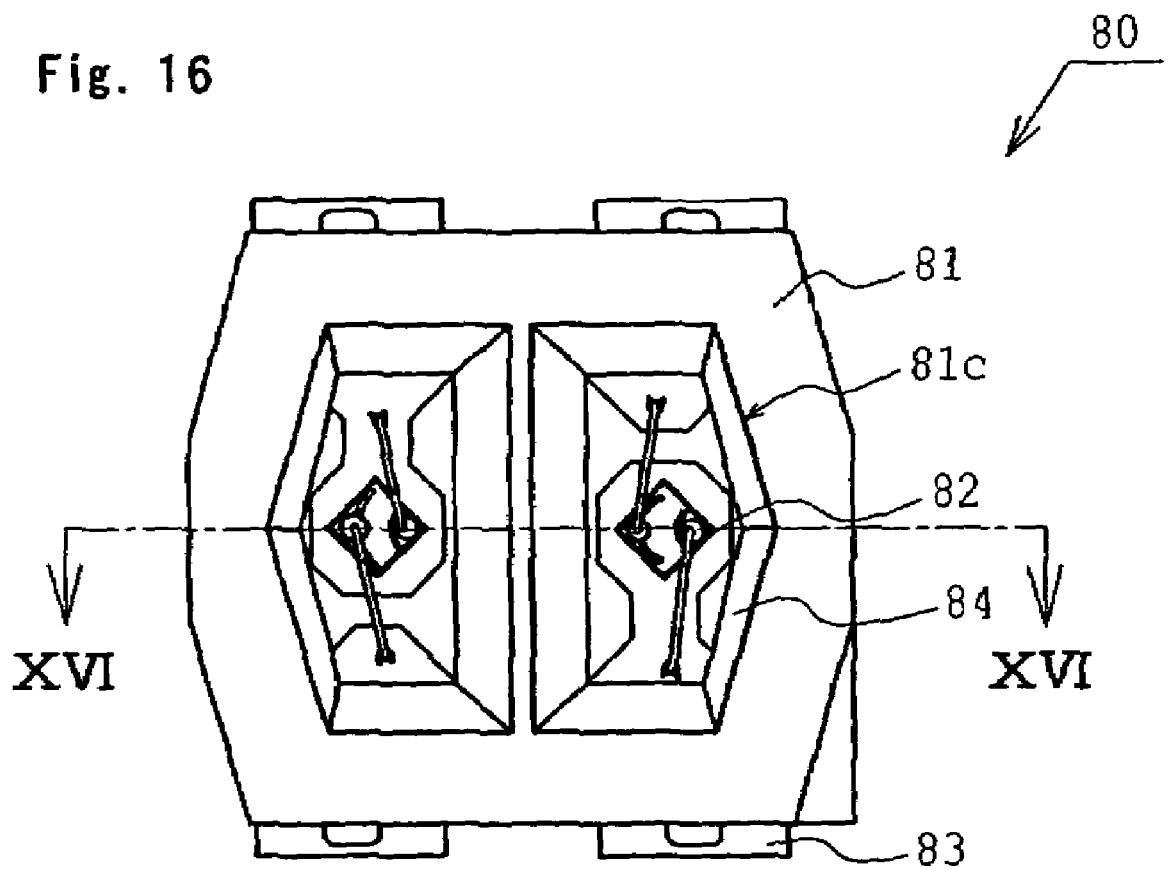
FIG. 16 shows a schematic plan view of a light emitting device according to the eighth embodiment of the present invention.
Figure 17:
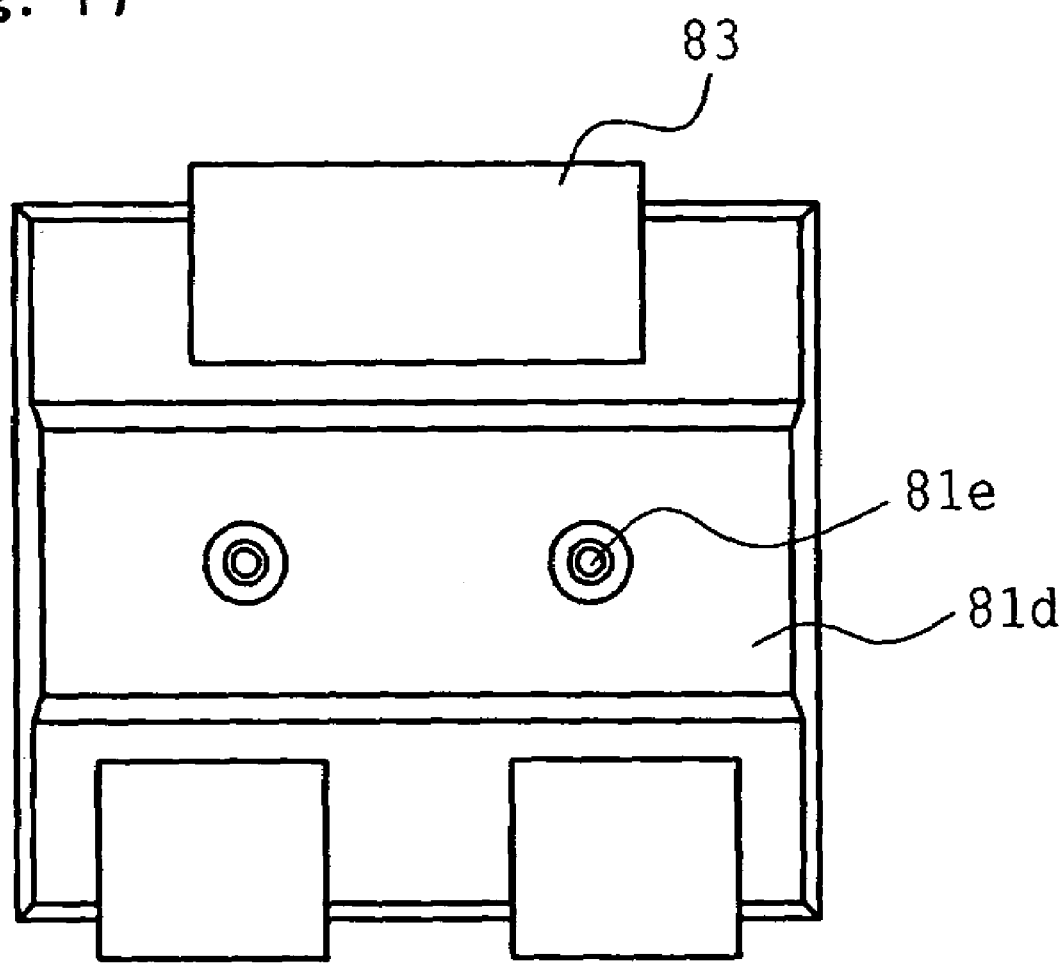
FIG. 17 is a schematic plan view showing a rear side of a light emitting device according to the eighth embodiment of the present invention.

FIG. 16 is a schematic plan view showing a light emitting device according to Embodiment 8. FIG. 17 is a schematic rear elevation showing a light emitting device according to Embodiment 8. A light emitting device according to Embodiment 8 will be described below, except for construction similar to that in Embodiment 1.

The light emitting device 80 according to Embodiment 8 has a similar construction to the light emitting device 10 according to Embodiment 1, except for the shapes and locations of the recesses 81c, the locations of the resin injection ports 81e, and the number of the electrodes 3. The circumferential shapes of the two openings 81c of the package 81 form, in combination, a substantially regular hexagon. A circumferential shape of a recess 81c is formed as a pentagon, which corresponds to approximately half of a substantially regular hexagon. The shape of the bottom surface 81a of the recess 81c is the same shape with a different size with respect to the pentagonal shape of the opening.

In the cross-sectional view taken along line XVI-XVI, which depicts a plane perpendicular to the longest lines of the pentagonal circumferences of the distal two recesses 81c, a vertical line passing through the center of the bottom surface 81a of the recess 81c is different than a vertical line passing through the intersection of a first straight line extending along an inclined side edge 81b of the recess 81c and a second straight line extending along an inclined side edge 81b on the other side of the recess 81c. The vertical line passing through the intersection locates closer to the edge of the package than the vertical line passing through the center of the recess. With this arrangement, a uniform mixed light can be obtained.

The package 81 is molded by injecting a resin from the resin injection inlets provided on the rear surface side of the bottom surface 81a of the recess 81c. A protruded portion 81d is formed on the backside of the package 81 in the same direction as the direction where the recesses 81c are formed. With this structure, the package 81 can be prevented from bending when die-bonding the light emitting element 82.

The electrodes 83 includes two cathode electrodes and an anode electrode, where the cathode electrodes and the anode electrode are disposed on opposite sides of the package.

Embodiment 9

Figure 18:
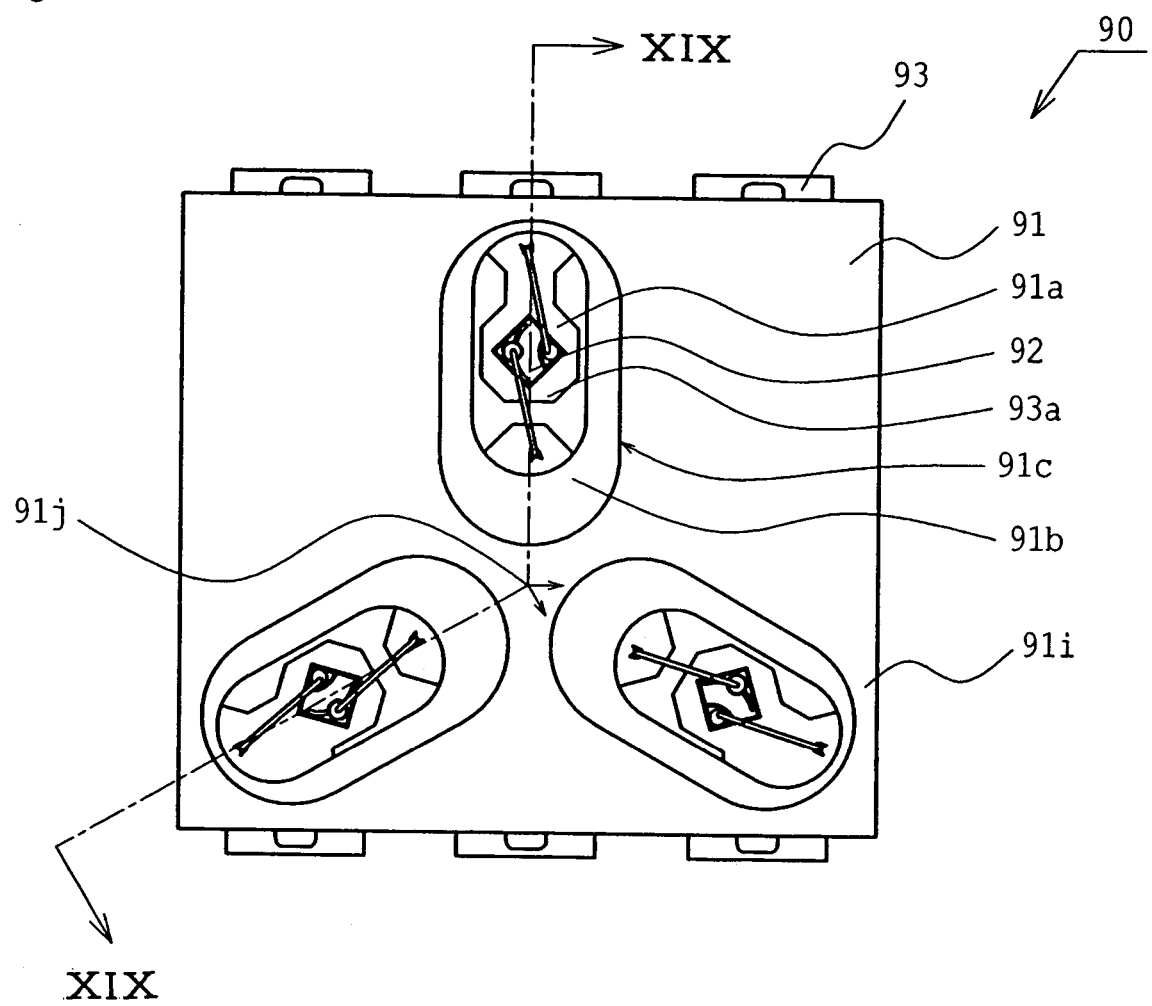
FIG. 18 shows a schematic plan view of a light emitting device according to the ninth embodiment of the present invention.
Figure 19:
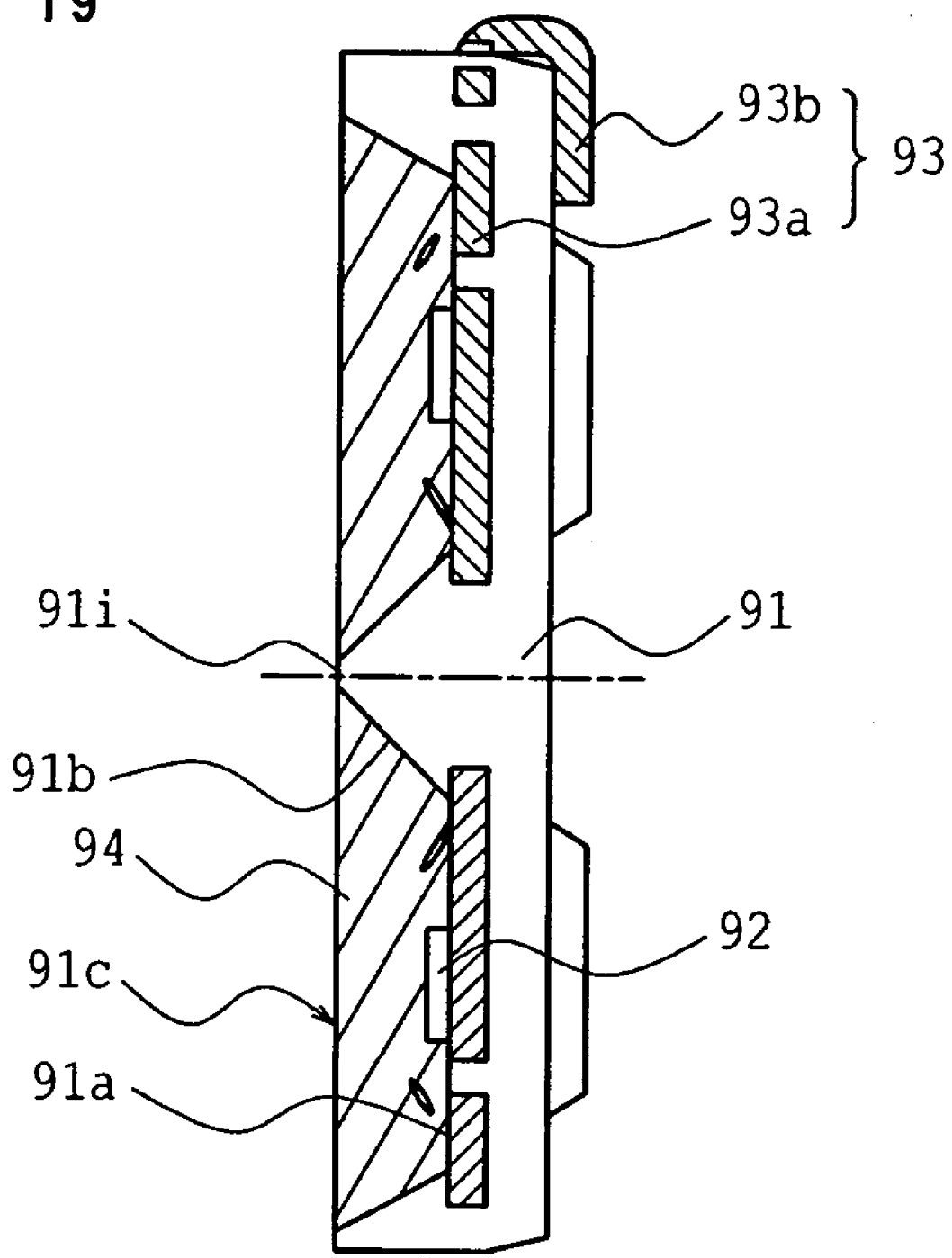
FIG. 19 shows a schematic cross-sectional view of a light emitting device taken along line XIX-XIX in FIG. 18 according to the ninth embodiment of the present invention.

FIG. 18 is a schematic plan view showing a light emitting device according to Embodiment 9. FIG. 19 is a schematic cross-sectional view taken along line XIX-XIX of FIG. 18, showing the light emitting device according to Embodiment 9. A light emitting device according to Embodiment 9 will be described below, except for the construction similar to that in Embodiment 1. A light emitting device according to Embodiment 9 will be described below, except for the elements which are similar to Embodiment 1.

The light emitting device 90 according to Embodiment 9 has a similar construction as the light emitting device 10 according to Embodiment 1, except for the number, locations, and the size of the recesses 91c.

Three recesses 91c are formed in the package 91 with their openings wider than the bottoms. The opening of each recess 91c is substantially elliptical shape. Here, the center point 91j is defined in relation to the locations of the three recesses 91c. The three recesses 91c are formed so as to spread out from the center point 91j. In the cross-sectional view taken along lines XIX-XIX, the recesses are symmetric about the vertical line passing through the center point 91j of the plurality of recesses. Here, each line starts at the center point 91j and extends along the long axis of each recess. With this structure, uniform mixed light can be obtained. However, in this cross-sectional view, the top surface 91i is not necessarily symmetrical. This is because the portion which greatly affects the directivity is the recess portion 91c. A blue, green, and red light emitting elements 92 are respectively mounted in the recesses 91c, so that each recess has a light emitting element. With this structure, the light emitting device 90 capable of emitting light with a variety of chromaticity values can be provided. Further, by changing the number of the light emitting elements 92 placed in each recess 91c, the chromaticity values and the brightness of the emitting light can be changed.

EXAMPLES

Example 1

A light emitting device according to the first embodiment will now be described below.

Figure 20:
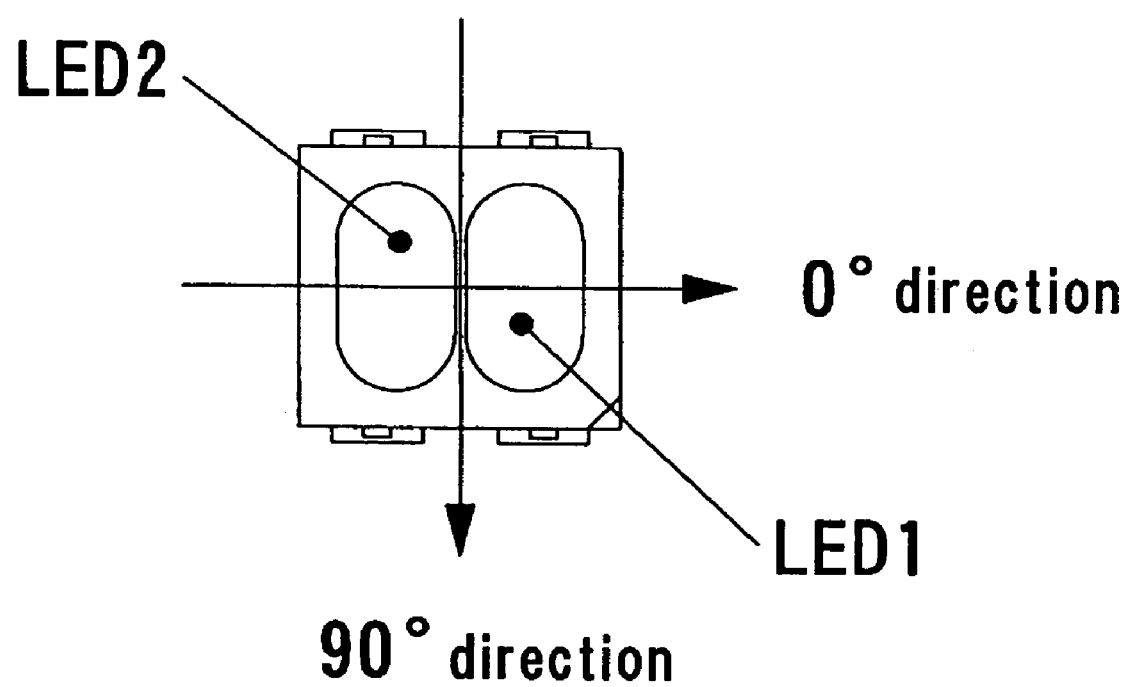
FIG. 20 is a schematic plan view indicating the measuring direction of the light emitting device according to the first example of the present invention.
Figure 21A:
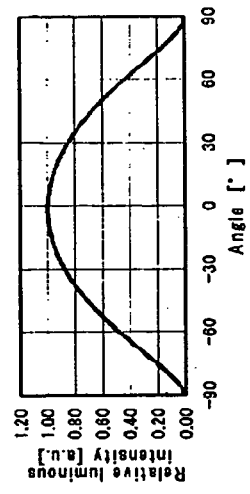
FIGS. 21A-21F show the measurement results of the directional patterns according to the first example of the present invention.
Figure 21B:
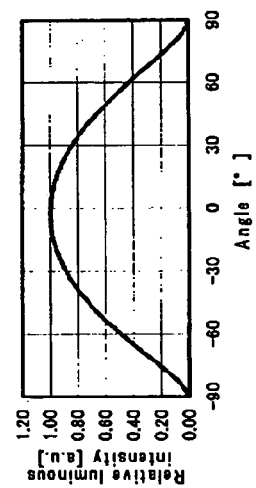
Figure 21C:
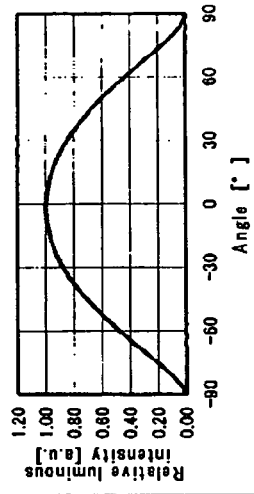
Figure 21D:
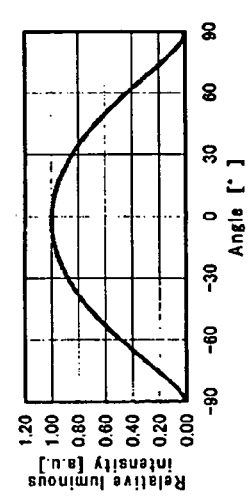
Figure 21E:
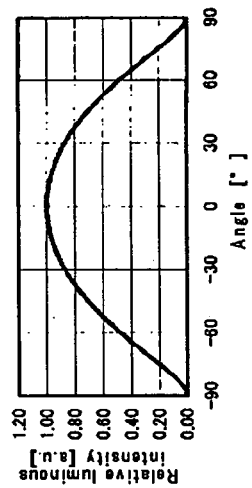
Figure 21F:
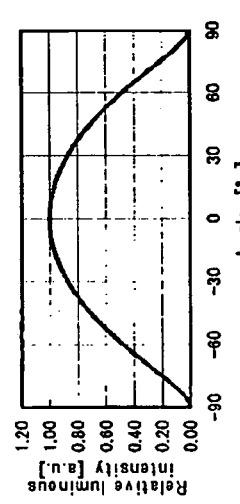
Figure 22:
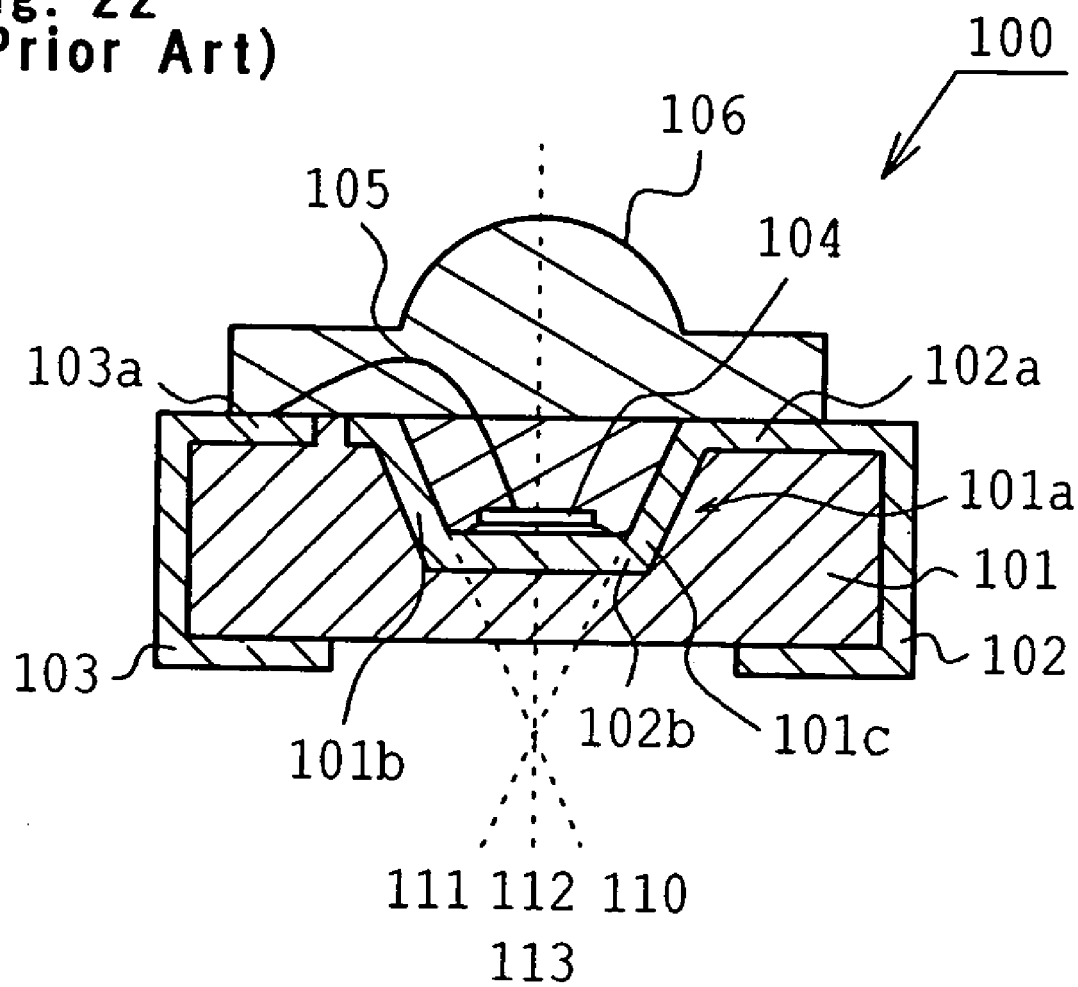
FIG. 22 shows a schematic cross-sectional view of a conventional light emitting device.

FIG. 1 is a schematic plan view showing a light emitting device according to Example 1. FIG. 2 is a cross-sectional view taken along line II-II of FIG. 1, showing the light emitting device according to Example 1. FIG. 3 is a cross-sectional view taken along line III-III of FIG. 1, showing the light emitting device according to Example 1. FIG. 4 is a schematic perspective view showing a backside of the light emitting device according to Example 1. FIG. 20 is a schematic plan view showing the direction of measurement of the light emitting device according to Example 1. FIGS. 21A to 21F are measurement results showing the directional characteristic of the light emitting device according to Example 1. In FIG. 21A, the directional characteristic of the light emitting device according to Example 1 is measured from the direction of 0°, while the LED 1 and the LED 2 are in an emitting state. In FIG. 21B, the directional characteristic of the light emitting device according to Example 1 is measured from the direction of 0°, where the LED 1 is in an emitting state. In FIG. 21C, the directional characteristic of the light emitting device according to Example 1 is measured from the direction of 0°, while the LED 2 is in an emitting state. In FIG. 21D, the directional characteristic of the light emitting device according to Example 1 is measured from the direction of 90°, while the LED 1 and the LED 2 are in an emitting state. In FIG. 21E, the directional characteristic of the light emitting device according to Example 1 is measured from the direction of 90°, while the LED 1 is in an emitting state. In FIG. 21F, the directional characteristic of the light emitting device according to Example 1 is measured from the direction of 90°, while the LED 2 is in an emitting state.

The light emitting device 10 according to Example 1 comprises a light emitting element 2 and a package 1. Two recesses are formed on the package, each of which has a bottom surface 1a for mounting a light emitting element and a side surface 1b extending from the bottom surface 1a. An electrode 3 is disposed on the bottom surface 1a of the recess 1c of the package 1, and a light emitting element 2 is mounted on a mounting portion 3a of the electrode 3.

The light emitting element 2 is of GaN-based, where an n-type compound semiconductor is stacked on a insulating sapphire substrate, and a p-type compound semiconductor is stacked thereon. In the light emitting element 2, the sapphire substrate is placed on the top surface of the electrode 3. An n-type electrode, formed on the n-type layer of the compound semiconductor, is electrically connected to the electrode 3 by a wire 5. A p-type electrode, formed on the p-type layer of the compound semiconductor, is electrically connected to the electrode 3 by a wire 5. The electrode consists of a pair of positive and negative electrodes. For the light emitting element 2, a blue-light emitting element having a peak emission wavelength at about 460 nm is used.

A recess 1c having wider opening than its bottom surface is formed on the package 1. The recess 1c has a bottom surface for mounting a light emitting element 2, and a side surface 1b extending from the bottom surface 1a.

The recess 1c has, in the vertical cross section of the recess 1c of the package 1, a vertical line a-a passing through the center of the bottom surface 1a of the recess 1c and this is located at a different position than a vertical line passing through the intersection of a first straight line b-b extending along an inclined side edge 1b of the recess 1c and a second straight line c-c extending along an inclined side edge on the other side of the recess 1c. The vertical line d-d passing through the intersection is located closer to the edge of the package than the vertical line a-a passing through the center. In a vertical cross section through the two recesses 1c, the two adjacent recesses 1c are symmetric about the vertical line e-e passing through the midpoint of the adjacent edges of the adjacent two recesses. The backside of the package 1 has a backside electrode portion 3b extending from the mounting portion 3a on the bottom surface of the recess 1c.

The thickness of the backside electrode portion 3b and the height of the protrusion 1d on the backside of the package 1 are adjusted so as to have substantially the same height when the light emitting device 10 is mounted. A mold for the package is formed with a predetermined configuration with the electrodes 3 set, then, resin is injected into the mold from the two resin injection inlets. After the resin is injected, the package resin is cured and the package 1 is detached from the mold. The backside of the package 1 has two resin injection ports 1e. The shape of the package is substantially a rectangular solid. The size of the package 1 is 3.0 mm in diameter, 3.0 mm in width, and 1.0 mm in thickness. An aromatic nylon (PPA) is used as the material for the package 1. The opening of the recess 1c formed on the package 1 is substantially oval, where one axis is about twice the length of the other axis. A substantially circular or square shape can be formed by aligning two substantially oval shapes side by side. The electrode 3 has a mounting portion 3a for mounting the light emitting element 2 and a backside electrode portion 3b continuous with the mounting portion 3a. The continuous backside electrode portion 3b is provided so as to connect to an external electrode. The electrode 3 is a copper alloy plated with silver by electric plating. The light emitting element 2 is mounted on the mounting portion 3a in a face-up manner. For a light-transmissive resin 4, an epoxy resin is used. A Yttrium Aluminum Garnet-based (YAG-based) fluorescent material activated with cerium is mixed into the transparent resin 4. A specific example of such a material includes $(Y,Gd)_3Al_5O_{12}$:Ce.

The measurement result of the directional characteristics of the light emitting element 10 of Example 1 shows a single peak in both cases of emitting one LED and emitting two LEDs. This means that the lights emitted from two light emitting elements are mixed.

Furthermore, in the case where two LEDs are in an emitting state, the overall light focuses on the vertical line e-e passing through the mid point between the adjacent edges of the two recesses. When two LEDs are in an emitting state, the peak width at half height of the light emitting device 10 is 115° in the direction of 0° and 118° in the direction of 90°. When the LED 1 is in an emitting state, the peak width at half height of the light emitting device 10 is 115° in the direction of 0° and 118° in the direction of 90°. When the LED 2 is in an emitting state, the peak width at half height of the light emitting device 10 is 115° in the direction of 0° and 118° in the direction of 90°. Those are the mean values obtained from the measurement of three light emitting devices 10 according to Example 1.

INDUSTRIAL APPLICABILITY

The light emitting device according to the present invention can be used for lighting apparatuses, displays, backlights of portable phones, flashes for cameras, auxiliary lights for time-varying image illumination, and packages and the like.

It is to be understood that although the present invention has been described with regards to preferred embodiments thereof, various other embodiments and variants may occur to those skilled in the art, which are within the scope and spirit of the invention, and such other embodiments and variants are intended to be covered by the following claims.

This application is based on Japanese Patent Application No. 2003-418002 filed on Dec. 16, 2003, the contents of which are incorporated hereinto by reference.

What is clamed is:

1. A light emitting device comprising:
   at least one light emitting element; and
   a package including a plurality of recesses, each recess having a bottom surface for mounting said at least one said light emitting element and a side surface extending from said bottom surface;
   a backside electrode portion which is extending from a mounting portion;
   wherein a recess is located on the back surface of the package;
   at least one of said plurality of recesses has, in a vertical cross section of the recess along a minor axis, a first angle formed between a top surface and an inclined side edge of the recess which is different than a second angle formed between a top surface and an inclined side edge on another side of the recess and said at least one of said plurality of recesses has, in a vertical cross section of the recess along a major axis, a third angle formed between the top surface and an inclined side edge of the recess which is equal to a fourth angle formed between the top surface and an inclined side edge on an opposite side of the recess, the thickness of the backside electrode portion and a protrusion on the backside of the package are substantially the same size,
   wherein the first angle is greater than 90 degrees and smaller than 180 degrees, the second angle is equal or greater than 90 degrees and smaller than 180 degrees, and the first angle is greater than the second angle, and
   wherein two adjacent recesses are formed in said package, and when viewed along a cross section vertical to top edges of the two adjacent recesses, said two adjacent recesses are symmetrical about a vertical line passing through a midpoint relative to adjacent edges of the two adjacent recesses, each of the two adjacent recesses has a first diameter having a length which is twice a length of a second diameter of the two adjacent recesses.

2. A light emitting device comprising:

at least one light emitting element; and a package including a plurality of recesses, each recess having a bottom surface for mounting said at least one light emitting element and a side surface extending from said bottom surface;

a backside electrode portion which is extending from a mounting portion;

wherein a recess is located on the back surface of the package;

at least one of said plurality of recesses having a configuration along a vertical cross section of the recess where a vertical line passing through a center of said bottom surface of said recess has a different location than a vertical line passing through an intersection of a first straight line extending along an inclined side edge and a second straight line extending along an inclined side edge on another side of said recess, the thickness of the backside electrode portion and a protrusion on the backside of the package are substantially the same size, said at least one of said plurality of recesses has, in a vertical cross section of the recess along a minor axis, a first angle formed between a top surface and the inclined side edge of the recess which is different than a second angle formed between a top surface and the inclined side edge on the another side of the recess and said at least one of said plurality of recesses has, in a vertical cross section of the recess along a major axis, a third angle formed between the top surface and an inclined side edge of the recess which is equal to a fourth angle formed between the top surface and an inclined side edge on an opposite side of the recess, wherein the first angle is greater than 90 degrees and smaller than 180 degrees, the second angle is equal or greater than 90 degrees and smaller than 180 degrees, and the first angle is greater than the second angle, and wherein two adjacent recesses are formed in said package, and when viewed along a cross section vertical to top edges of the two adjacent recesses, said two adjacent recesses are symmetrical about a vertical line passing through a midpoint relative to adjacent edges of the two adjacent recesses, each of the two adjacent recesses has a first diameter having a length which is twice a length of a second diameter of the two adjacent recesses.

3. The light emitting device according to claim 2, wherein the plurality of adjacent recesses are formed in said package, and when viewed in a vertical cross section through said plurality of adjacent recesses, said plurality of adjacent recesses are symmetrical about a vertical line passing through a center point of said plurality of adjacent recesses.

4. The light emitting device according to claim 2, wherein each of said light emitting elements is covered by a transparent resin in each of said recesses.

5. A package including a plurality of recesses, each said recess having a bottom surface for mounting a light emitting element and a side surface extending from said bottom surface, a backside electrode portion which is extending from a mounting portion;

wherein a recess is located on the back surface of the package;

at least one of said recesses has, in a vertical cross section of the recess along a minor axis, a first angle formed between a top surface and an inclined side edge which is different than a second angle formed between a top surface and an inclined side edge on another side of the recess and said at least one of said plurality of recesses has, in a vertical cross section of the recess along a major axis, a third angle formed between the top surface and an inclined side edge of the recess which is equal to a fourth angle formed between the top surface and an inclined side edge on an opposite side of the recess, the thickness of the backside electrode portion and a protrusion on the backside of the package are substantially the same size, wherein the first angle is greater than 90 degrees and smaller than 180 degrees, the second angle is equal or greater than 90 degrees and smaller than 180 degrees, and the first angle is greater than the second angle, and wherein two adjacent recesses are formed in said package, and when viewed along a cross section vertical to top edges of the two adjacent recesses, said two adjacent recesses are symmetrical about a vertical line passing through a midpoint relative to adjacent edges of the two adjacent recesses, each of the two adjacent recesses has a first diameter having a length which is twice a length of a second diameter of the two adjacent recesses.

6. A package including a plurality of recesses, each said recess having a bottom surface for mounting a light emitting element and a side surface extending from said bottom surface, a backside electrode portion which is extending from a mounting portion;

wherein a recess is located on the back surface of the package;

at least one of said recesses has, in a vertical cross section of the recess, a vertical line passing through a center of said bottom surface of said recess which is at a different location than a vertical line passing through an intersection of a first straight line extending along an inclined side edge of said recess and a second straight line extending along an inclined side edge on another side of said recess, the thickness of the backside electrode portion and a protrusion on the backside of the package are substantially the same size, said at least one of said plurality of recesses has, in a vertical cross section of the recess along a minor axis, a first angle formed between a top surface and the inclined side edge of the recess which is different than a second angle formed between a top surface and the inclined side edge on the another side of the recess and said at least one of said plurality of recesses has, in a vertical cross section of the recess along a major axis, a third angle formed between the top surface and an inclined side edge of the recess which is equal to a fourth angle formed between the to p surface and an inclined side edge on an opposite side of the recess, wherein the first angle is greater than 90 degrees and smaller than 180 degrees, the second angle is equal or greater than 90 degrees and smaller than 180 degrees, and the first angle is greater than the second angle, and wherein two adjacent recesses are formed in said package, and when viewed along a cross section vertical to top edges of the two adjacent recesses, said two adjacent recesses are symmetrical about a vertical line passing through a midpoint relative to adjacent edges of the two adjacent recesses, each of the two adjacent recesses has a first diameter having a length which is twice a length of a second diameter of the two adjacent recesses.

7. The package according to claim 6, further comprising positive and negative electrodes disposed on at least a portion of the bottom surface of each recess.

8. The package according to claim 6, further comprising positive and negative electrodes extending from the bottom surface of each recess to a backside thereof and a protrusion having a thickness equal to a thickness of said electrodes formed on the backside thereof.

9. The package according to claim 6, further comprising a plurality of resin injection ports disposed on a backside of said package.

10. The package according to claim 6, wherein a plurality of adjacent recesses are formed therein, and in a cross section perpendicular to top edges of said plurality of adjacent recesses, said plurality of adjacent recesses are symmetrical about a vertical line passing through a center point of said plurality of adjacent recesses.

11. A light emitting device comprising:

at least one light emitting element; and a package including a plurality of recesses, each recess having a bottom surface for mounting said at least one said light emitting element and a side surface extending from said bottom surface;

a backside electrode portion which is extending from a mounting portion;

wherein a recess is located on the back surface of the package;

at least one of said plurality of recesses has, in a vertical cross section of the recess along a minor axis, a first angle formed between a top surface and an inclined side edge of the recess which is equal to a second angle formed between a top surface and an inclined side edge on another side of the recess and said at least one of said plurality of recesses has, in a vertical cross section of the recess along a major axis and passing through a center point of said plurality of adjacent recesses, a third angle formed between the top surface and an inclined side edge of the recess which is different than a fourth angle formed between the top surface and an inclined side edge on an opposite side of the recess, wherein the third angle is greater than 90 degrees and smaller than 180 degrees, the fourth angle is equal or greater than 90 degrees and smaller than 180 degrees, and the third angle is greater than the fourth angle.

* * * * *

UNITED STATES PATENT AND TRADEMARK OFFICE
CERTIFICATE OF CORRECTION

PATENT NO. : 7,656,083 B2 Page 1 of 1
APPLICATION NO. : 11/012666
DATED : February 2, 2010
INVENTOR(S) : Naofumi Sumitani It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 786 days.

Signed and Sealed this

Twenty-eighth Day of December, 2010

David J. Kappos
*Director of the United States Patent and Trademark Office*